(12) United States Patent
Kariyazaki et al.

(10) Patent No.: US 12,199,053 B2
(45) Date of Patent: Jan. 14, 2025

(54) ELECTRONIC DEVICE AND SEMICONDUCTOR DEVICE

(71) Applicant: RENESAS ELECTRONICS CORPORATION, Tokyo (JP)

(72) Inventors: Shuuichi Kariyazaki, Tokyo (JP); Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 474 days.

(21) Appl. No.: 17/720,689

(22) Filed: Apr. 14, 2022

(65) Prior Publication Data

US 2023/0335512 A1  Oct. 19, 2023

(51) Int. Cl.

| | | |
|---|---|---|
| *H01L 23/66* | (2006.01) |
| *H01L 23/00* | (2006.01) |
| *H01L 23/498* | (2006.01) |
| *H01L 25/065* | (2023.01) |
| *H01L 25/18* | (2023.01) |
| *H01P 3/08* | (2006.01) |

(52) U.S. Cl.
CPC ........ *H01L 23/66* (2013.01); *H01L 23/49822* (2013.01); *H01L 23/49838* (2013.01); *H01L 24/16* (2013.01); *H01L 25/0655* (2013.01); *H01L 25/18* (2013.01); *H01P 3/08* (2013.01); *H01L 2223/6627* (2013.01); *H01L 2224/16157* (2013.01); *H01L 2924/1431* (2013.01); *H01L 2924/1434* (2013.01); *H01L 2924/19031* (2013.01)

(58) Field of Classification Search
CPC ..... H01L 23/49822; H01L 2924/30111; H01L 2924/3025; H01L 2924/1431; H01L 2924/1434; H01L 2224/16157; H01L 2924/19031; H01P 3/08
See application file for complete search history.

(56) References Cited

U.S. PATENT DOCUMENTS

| | | | |
|---|---|---|---|
| 10,643,960 B2 | 5/2020 | Kariyazaki et al. |
| 2018/0261274 A1* | 9/2018 | Suwa | ......... H01L 23/5383 |

FOREIGN PATENT DOCUMENTS

| | | |
|---|---|---|
| JP | 2019-114675 A | 7/2019 |
| WO | 2012/176330 A1 | 12/2012 |

* cited by examiner

*Primary Examiner* — Shih Tsun A Chou
(74) *Attorney, Agent, or Firm* — Rimon P.C.

(57) ABSTRACT

The wiring board has a first region overlapping a first semiconductor device and a second region not overlapping each of the first semiconductor device and a second semiconductor device. A first signal wiring of the wiring board has a first portion in the first region and a second portion in the second region. In a thickness direction of the wiring board, the second portion is between two ground patterns to which a reference potential is supplied, while the first portion has a portion not positioned between two ground patterns to which a reference potential is supplied. The first portion has a first wide portion having a larger width than a width of the second portion.

20 Claims, 14 Drawing Sheets

ELECTRONIC DEVICE AND SEMICONDUCTOR DEVICE

BACKGROUND

The present invention relates to an electronic device and a semiconductor device.

Here, there are disclosed techniques listed below.
[Patent Document 1] Japanese Unexamined Patent Application Publication No. 2019-114675
[Patent Document 2] Japanese Unexamined Patent Application Publication (Translation of PCT application) No. 2012-176330

Patent Document 1 discloses an electronic device (semiconductor module) in which a plurality of semiconductor devices that are mounted on a wiring board are electrically connected with one another through the wiring board. Patent Document 2 discloses a semiconductor device in which a plurality of semiconductor chips that are mounted on a wiring board are electrically connected with one another through the wiring board.

SUMMARY

One of needs for improvement of a performance of such an electronic device as described above is, for example, needs for increase of a transmission speed between a logic circuit, and a memory circuit or needs for downsizing of the device. However, the increase of the transmission speed tends to increase the size of the electronic device. In order to suppress the increase in the size of the electronic device due to the increase of the transmission speed, a technique for densely mounting a lot of signal transmission paths is necessary.

Other objects and novel characteristics will be apparent from the description of the present specification and the accompanying drawings.

An electronic device according to one embodiment includes: a first semiconductor device; a second semiconductor device electrically connected with the first semiconductor device; and a wiring board on which the first semiconductor device and the second semiconductor device are mounted. The wiring board includes a plurality of signal wirings electrically connected with each of the first semiconductor device and the second semiconductor device. The plurality of signal wirings includes a first signal wiring that is a transmission path for a first signal. The wiring board has a first region overlapping the first semiconductor device and a second region not overlapping each of the first semiconductor device and the second semiconductor device. The first signal wiring has a first portion arranged in the first region and a second portion arranged in the second region. In a thickness direction of the wiring board, the second portion is positioned between two ground patterns to which a reference potential is supplied, while the first portion has a portion not positioned between two ground patterns to which a reference potential is supplied. The first portion has a first wide portion having a larger width than a width of the second portion.

According to the one embodiment, the performance of the electronic device can be improved.

BRIEF DESCRIPTIONS OF THE DRAWINGS

Figure 1:
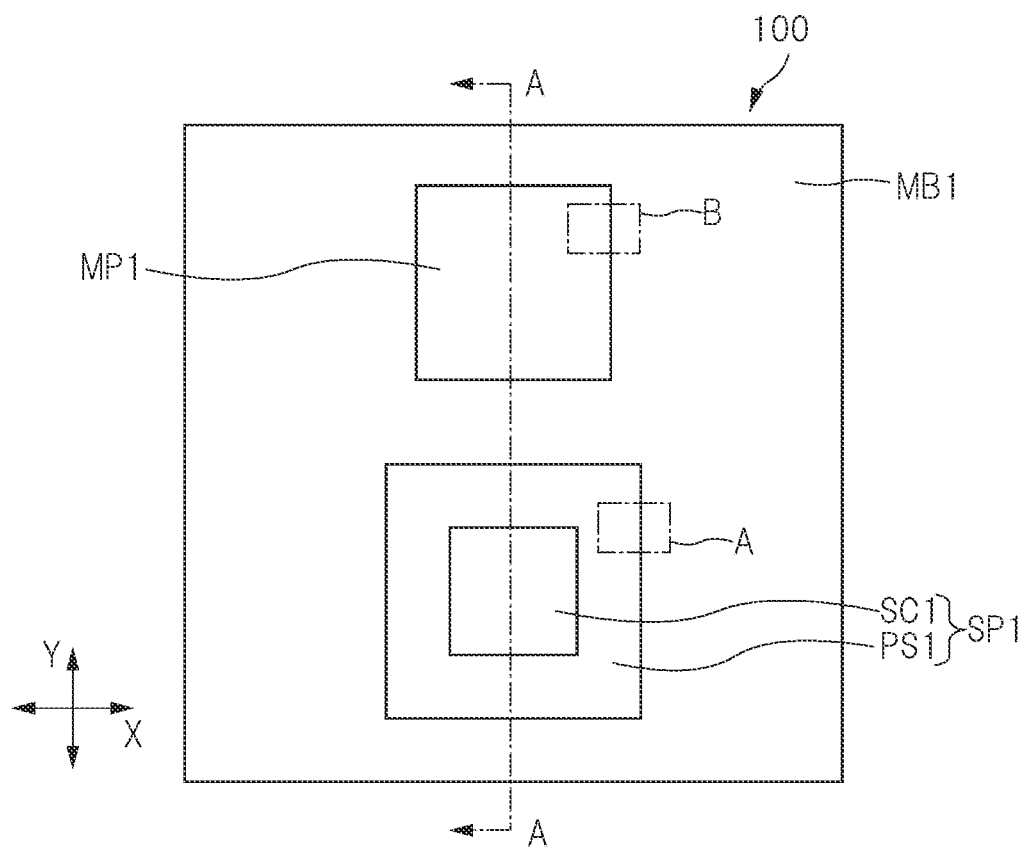
FIG. 1 is a plan view showing a top-view layout of an electronic device of one embodiment.

DETAILED DESCRIPTION (Explanation of Description Form, Basic Term and Usage in Present Application)

In the present application, the embodiments will be described in a plurality of sections or others as needed when required as a matter of convenience. However, these sections or others are not irrelevant to each other unless otherwise particularly stated. Regardless of before and after the description, one part of a simple example is a detailed part, a part, or the entire of a modification example of the other. Also, in principle, the repetitive description of the same part is omitted. Further, each element in the embodiment is not indispensable unless otherwise particularly stated not to be so, logically limited to the number, and clearly not being so from the contexts.

Similarly, when a material, a composition or others is described as "X made of A" or others in the description of the embodiments or others, the one containing other components than A is not excluded unless otherwise stated not to be so and clearly not being so from the contexts. For example, the component means "X containing A as a main component" or others. For example, it is needless to say that a "silicon material" and others includes not only pure silicon but also SiGe (silicon germanium) alloy or other multicomponent alloy containing silicon as a main component, or a material containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, the specific numerical value and the numerical amount may exceed the specific numerical values or smaller than the specific numerical values unless otherwise specified not to be so, logically limited to the number, and clearly not being so from the contents.

Still further, in each drawing of the embodiment, the same or similar parts are denoted by the same or similar symbol or reference number, and the description thereof is not repeated in principle.

Also, in the attached drawings, hatching or others is omitted even in a cross-sectional view in some cases such as a case of causing complication or a case of clearly distinguishing a portion from a space. In respect to this, a background outline is omitted even in a closed hole in a plan view when being clear from the explanation or others. Further, hatching or a dot pattern is added to a drawing in some cases in order to clearly show that the portion is not the space or clearly show a boundary between regions even if the drawing is not a cross-sectional view.

In the present specification, a "semiconductor device" is a component using electrons inside a semiconductor. As examples of this "semiconductor device", a semiconductor chip and a semiconductor package in which a semiconductor chip is packaged are exemplified. Therefore, terms including the "semiconductor chip" and the "semiconductor package" mean the "semiconductor device". A plurality of electrically-connected semiconductor devices that are mounted on a wiring board and that are modulated are called "electronic device". The electronic device is also called semiconductor module in some cases. A plurality of semiconductor chips that are stacked and that are packaged are included in the semiconductor device, but are also called memory package in some cases when the plurality of semiconductor chips include a memory chip. In explanation for embodiments and modification examples explained below, the "semiconductor chip", the "semiconductor device", the "electronic device" will be distinctively explained. However, the "semiconductor chip" and the "electronic device" are included in the "semiconductor device" in a broad sense.

<Electronic Device>

As one example of the electronic device in which the plurality of semiconductor devices are electrically connected through the wiring board in the present embodiment, an electronic device on which semiconductor devices are mounted will be exemplified and explained, the semiconductor device including an SoC (System on Chip) and the semiconductor device including a memory circuit connected with the SoC. The SoC is a semiconductor chip in which a system circuit configuring a computer system including a logic circuit is formed. The SoC itself includes the memory circuit in some cases. However, increase in a storage capacity of the memory circuit in the SoC increases a size of the SoC. Therefore, even if the SoC includes the memory circuit, the SoC needs to communicate with an external memory component for processing a large amount of data.

The electronic device exemplified as one example of the present embodiment is a highly-functionalized electronic device provided with various functions (systems) in one device. As the electronic device provided with the plurality of systems as described above, a method of mounting a plurality of semiconductor devices (such as a semiconductor device for control and a semiconductor device for storage) having different functions on a motherboard and electrically connecting the plurality of semiconductor devices through a wiring of the motherboard is considerable. An electronic device will be explained below, the electronic device including a semiconductor package including a logic circuit on a wiring board functioning as the motherboard and including a semiconductor package including a memory circuit mounted thereon. However, as a modification example, the following technique is applied to so-called multi-chip module (MCM: Multi-Chip Module) including a plurality of semiconductor packages mounted on a wiring board in some cases.

Figure 2:
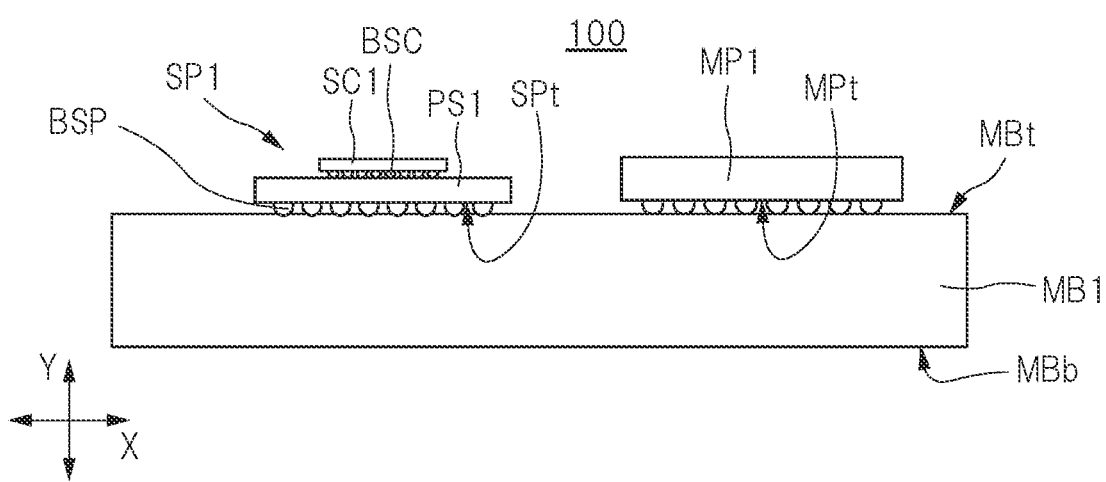
FIG. 2 is a cross-sectional view taken along a line A-A of FIG. 1.

FIG. 1 is a plan view showing a top-view layout of the electronic device of the present embodiment. FIG. 2 is a cross-sectional view taken along a line A-A of FIG. 1. The electronic device (electronic apparatus) 100 shown in FIG. 1 includes a wiring board (motherboard, mounting substrate) MB1, a semiconductor device (SoC package) SP1 mounted on the wiring board MB1, and a memory package (semiconductor device) MP1 mounted on the wiring board MB1. Note that a simply example is shown as the example in FIG. 1 in order to easily see the drawing. Therefore, as the modification example, another electronic component (such as a capacitor and a power regulator) not shown in FIG. 1 is mounted on the wiring board MB1 in some cases. As the example shown in FIGS. 1 and 2, an example of mounting one semiconductor device SP1 and one memory package MP1 on the wiring board MB1 is shown. However, as a modification example, three or more semiconductor devices are mounted in some cases. For example, an aspect of connection of one semiconductor device SP1 with two or more memory packages MP1 or others can be exemplified. As shown in FIG. 2, the semiconductor device SP1 is a semiconductor package including, for example, a semiconductor chip SC1 that is the SoC mounted and packaged on the package substrate PS1 that is the wiring board (interposer substrate). However, as described later as a modification example, a technique that will be explained below with reference to the electronic device 100 is applicable to a semiconductor device including the semiconductor chip SC1 that is the SoC and the memory package MP1 directly mounted and packaged on the package substrate PS1. Such a package is called SiP (System in Package). Note that the SiP is one aspect of the above-described MCM.

As shown in FIG. 2, the wiring board MB1 included in the electronic device 100 has a main surface (plane, upper surface, semiconductor-device mounting surface) MBt on which the semiconductor device SP1 and the memory package MP1 are mounted and a main surface (plane, lower surface) MBb on an opposite side of the main surface MBt. In the example shown in FIG. 2, each of the main surface MBt and the main surface MBb of the wiring board MB1 has a rectangular shape. However, the shape of the wiring board MB1 has various modification examples.

Figure 3:
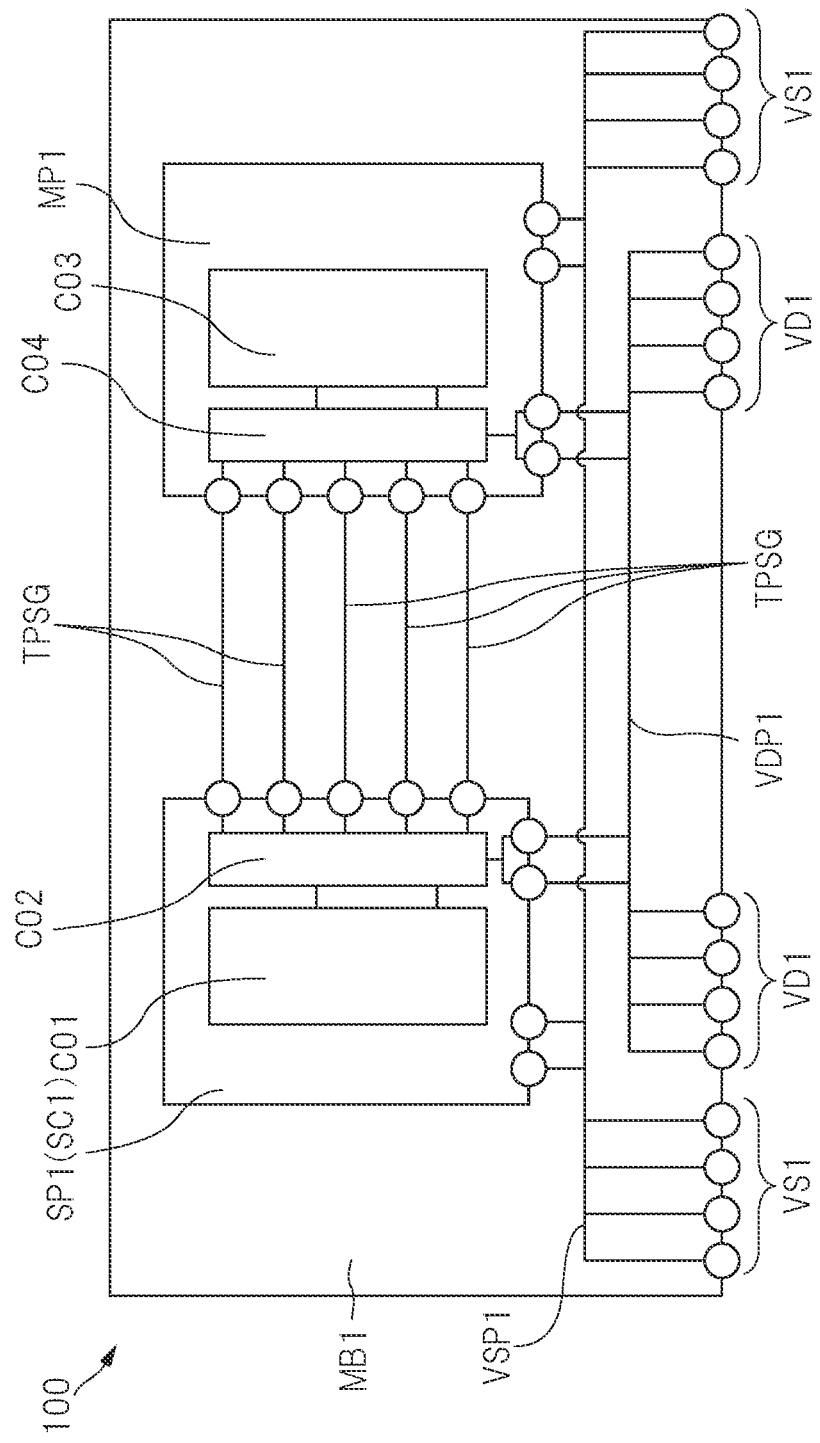
FIG. 3 is a circuit block view showing one example of electrical connecting relation of the electronic device in FIG. 1.

FIG. 3 is a circuit block view showing one example of electrical connecting relation of the electronic device shown in FIG. 1. As shown in FIG. 1, the semiconductor device SP1 includes a logic circuit C01 and an input/output circuit C02 electrically connected with the logic circuit C01. The memory package MP1 includes a memory circuit C03 and an input/output circuit C04 electrically connected with the memory circuit C03. The semiconductor device SP1 and the memory package MP1 are electrically connected with each other through a plurality of signal transmission paths. In the example shown in FIG. 3, the plurality of signal transmission paths are, for example, a plurality of signal transmission paths TPSG through which single-end electrical signals are transmitted. However, as a modification example, the plurality of signal transmission paths include a transmission path for differential signals in some cases. The electronic device 100 includes a lot of signal transmission paths TPSG. FIG. 3 shows five signal transmission paths TPSG as an example for easily seeing the drawing.

The signals that are transmitted between the semiconductor device SP1 and the memory package MP1 include not only the data signal but also control system signals such as a command signal and an address signal. A signal transmitted in the signal transmission path TPSG shown in FIG. 3 and a signal transmitted in a signal wiring WSG1 shown in FIG. 6 and others described later are the data signals.

A power supply potential VD1 and a reference potential VS1 are supplied to the semiconductor device SP1 and the memory package MP1, respectively. FIG. 3 shows a supply path for the power supply potential VD1 shared between the semiconductor device SP1 and the memory package MP1 among a plurality of types of power supply potentials supplied to the semiconductor device SP1 and the memory package MP1. The power supply potential VD1 is used as, for example, power for signal input/output in the semiconductor device SP1 and the memory package MP1 Therefore, in the example shown in FIG. 3, a supply path VDP1 for the power supply potential VD1 is connected with the input/output circuit C02 of the semiconductor device SP1 and the input/output circuit C04 of the memory package MP1. The reference potential VS1 is, for example, a ground potential, and is used in various circuits of the semiconductor device SP1 and the memory package MP1. In FIG. 3, a destination of the connection of the supply path VSP1 for the reference potential VS1 inside each of the semiconductor device SP1 and the MP1 is connected with each of a plurality of circuits (including the logic circuit C01, the input/output circuit C02, the memory circuit C03 and the input/output circuit C04) included in the semiconductor device SP1 and the memory package MP1 although its illustration is omitted.

In each of the semiconductor device SP1 and the memory package MP1 that need a lot of signal transmission paths, the suppression of the increase in the product size (a physical mounting area) increases an arrangement density of the signal transmission paths. And, in order to suppress malfunction in a lot of signal transmission paths, it is necessary to stabilize the power supply, and it is necessary to increase a cross-sectional area of the path for the power supply (the supply path for the power supply potential and the supply path for the reference potential). Since the increase in the path for the power supply decreases an occupied area of the signal transmission paths, it is necessary to increase the arrangement density of the signal transmission paths. The increase in the arrangement density of the signal transmission paths decreases a separate distance between adjacent signal transmission paths, and therefore, increases interference between the signal transmission paths such as cross talk noise, and affects a signal quality.

Transmission terminals for signals and terminals for power supply are densely arranged in a part of the wiring board MB1 where the terminals electrically connected with the semiconductor device SP1 and the memory package MP1 are arranged. Therefore, in regions of the wiring board MB1 overlapping the semiconductor device SP1 and overlapping the memory package MP1, it is difficult in a first layer of the wiring board MB1 to arrange a conductor pattern having a large area functioning as an electromagnetic shield for the signal wiring. In other words, a wiring structure of the signal wiring (in other words, a parasitic capacitance on the signal wiring) in the regions of the wiring board MB1 overlapping the semiconductor device SP1 and overlapping the memory package MP1 is different from a wiring structure in a different region in some cases. In the portion having the different wiring structure in the signal transmission path, a characteristic impedance of the signal transmission path tends to shift from a design value. In other words, the portion having the different wiring structure in the signal transmission path tends to have an impedance discontinuous state. In an impedance discontinuous section, a signal transmission efficiency tends to be decreased by influence of signal reflection or others. And, in the impedance discontinuous section, a signal quality of a transmitted signal tends to be decreased. When the section having the impedance discontinuous state is equal to or larger than 1/20 of a wavelength of the transmitted signal, the influence of the signal equality decrease tends to be significant although described in detail later.

Accordingly, the inventors of the present application have studied control for a wiring width of the signal wiring as one aim of technical development for improving the signal quality.

<Semiconductor Device>

Figure 4:
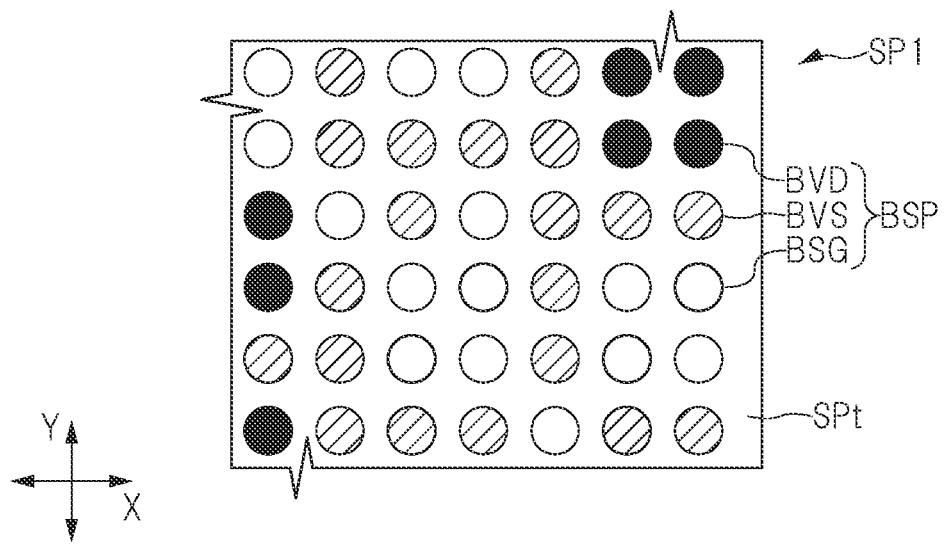
FIG. 4 is an enlarged plan view showing a terminal arrangement surface of a semiconductor device including a logic circuit among two semiconductor devices shown in FIG. 1.
Figure 5:
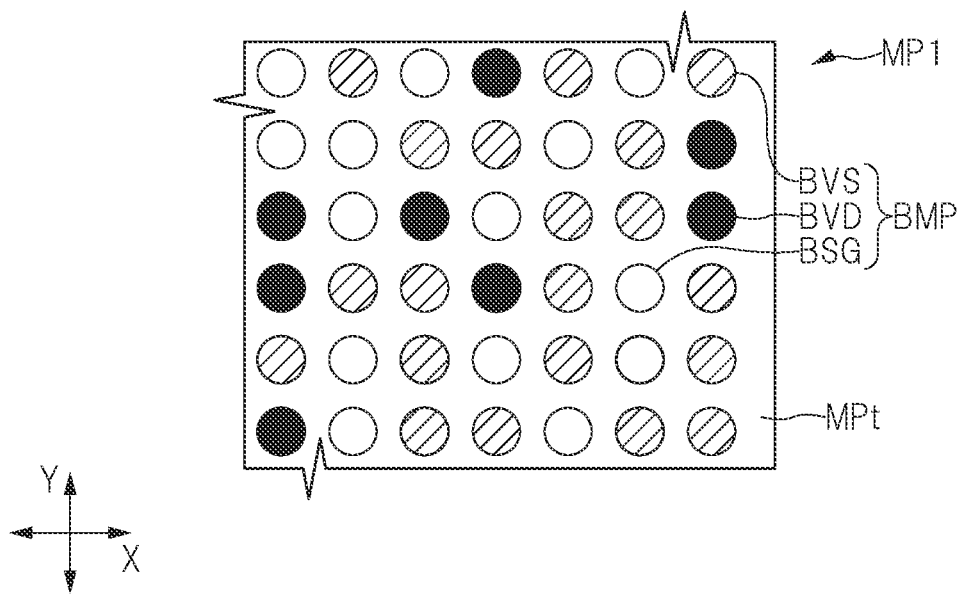
FIG. 5 is an enlarged plan view showing a terminal arrangement surface of a memory package among the two semiconductor devices shown in FIG. 1.

First, the semiconductor device SP1 and the memory package MP1 shown in FIG. 1 will be explained. FIG. 4 is an enlarged plan view showing a terminal arrangement surface of the semiconductor device including the logic circuit among two semiconductor devices shown in FIG. 1. FIG. 5 is an enlarged plan view showing a terminal arrangement surface of the memory package among two semiconductor devices shown in FIG. 1. FIG. 4 is an enlarged plan view within a range of an A portion shown in FIG. 1, and FIG. 5 is an enlarged plan view within a range of a E portion shown in FIG. 1. In FIGS. 4 and 5, the signal terminal, the power supply terminal and the reference potential terminal are denoted with a different hatching or a different filled pattern to easily distinguish the terminals from one another.

The semiconductor device SP1 shown in FIG. 4 has a main surface (plane) SPt that is the terminal arrangement surface where a plurality of terminals BSP are arranged. As shown in FIG. 2, in the electronic device 100, the main surface SPt faces a main surface (plane) MBt that is a mounting surface of the wiring board MB1. The plurality of terminals BSP on the main surface SPt are arranged in a matrix form on the main surface SPt. Each of the plurality of terminals BSP is, for example, a solder ball. The plurality of terminals BSP include a plurality of signal terminals BSG which are electrically connected with the memory package MP1 (see FIG. 3) and to which signals are transmitted. The plurality of terminals BSP further include a reference potential terminal BVS to which a reference potential VS1 (see FIG. 3) is supplied, and a power supply terminal BVD to which a power supply potential VD1 (see FIG. 3) is supplied. Each of the terminal BSP shown in FIG. 4 and the terminal BMP shown in FIG. 5 is, for example, a solder ball.

A semiconductor chip SC1 shown in FIGS. 1 and 2 is, for example, a semiconductor chip including circuits including a plurality of semiconductor elements formed on a substrate made of silicon. An arrangement pitch between the terminals BSC (see FIG. 2) of the semiconductor chip SC1 is smaller than an arrangement pitch between the terminals BSP of the package board PS1. In the present embodiment, since the package board PS1 interposes between the semiconductor chip SC1 and the wiring board MB1, an arrangement pitch between the terminals of the wiring board MB1 is made larger than the arrangement pitch between the terminals of the semiconductor chip SC1.

A memory package MP1 shown in FIG. 5 has a main surface (plane) MPt that is a terminal arrangement surface where the plurality of terminals BMP are arranged. As shown in FIG. 2, in the electronic device 100, the main surface MPt faces the main surface (plane) MBt that is the mounting surface of the wiring board MB1. The plurality of terminals BMP on the main surface MPt are arranged in a matrix form on the main surface MPt. Each of the plurality of terminals BMP is, for example, a solder ball. The plurality of terminals BMP include a plurality of signal terminals BSG which are electrically connected with the memory package MP1 (see FIG. 3) and to which signals are transmitted. The plurality of terminals BMP further include a reference potential terminal BVS to which a reference potential VS1 (see FIG. 3) is supplied, and a power supply terminal BVD to which a power supply potential VD1 (see FIG. 3) is supplied.

Although not illustrated, the memory package MP1 has a structure in which, for example, a plurality of memory chips are connected in a thickness direction. Each of the plurality of memory chips is connected with any of the plurality of terminals BMP shown in FIG. 5.

<Wiring Board>

Figure 6:
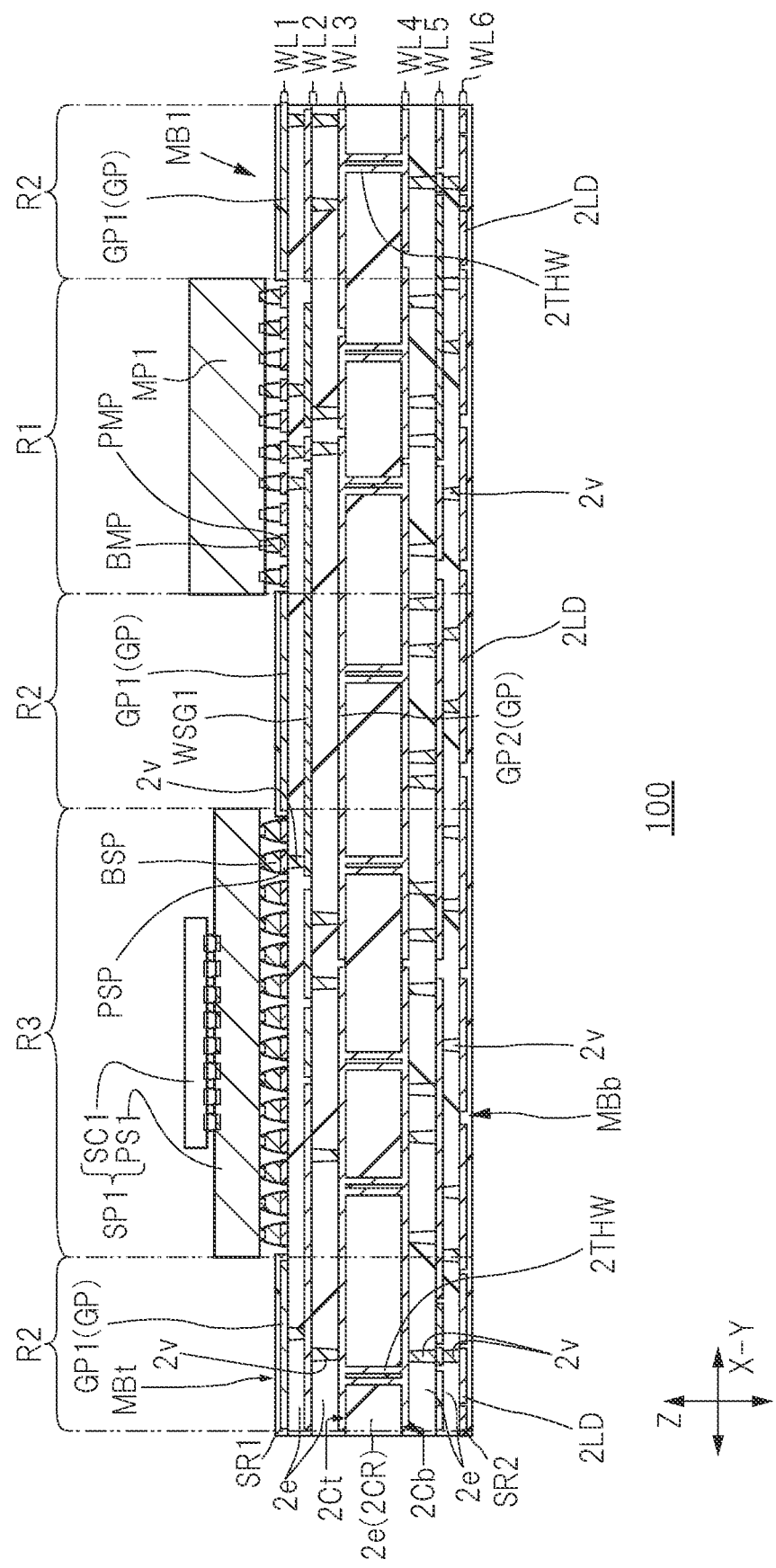
FIG. 6 is a cross-sectional view showing an outline of a configurational example of a plurality of conductor layers included in a wiring board shown in FIG. 2.

Next, a configurational example of the wiring board MB1 shown in FIGS. 1 to 3 will be explained. FIG. 6 is a cross-sectional view showing an outline of a configurational example of a plurality of conductor layers included in the wiring board shown in FIG. 2. In the following explanation, the term "conductor layer" means a layer where various patterns such as a wiring pattern, a land pattern, a terminal pattern or a plane pattern having a large area are formed. The "conductor layer" can be also regarded as a "wiring layer".

The following explanation uses a simple expression that is overlapping of "A" with "B" or an expression that is overlapping of "A" with "B" in a transparent plan view in some cases. Such an expression means that "A" and "B" overlap each other in a thickness direction (such as a Z direction shown in FIG. 6) of a structure. Therefore, for example, in FIG. 6, the expression that is the overlapping of "A" with "B" can be replaced with an expression that is overlapping of "A" with "B" in the thickness direction of the wiring board MB1. In this case, the thickness direction of the wiring board MB1 means a direction heading from either one of the main surface MBt and the main surface MBb shown in FIG. 6 to the other (that is the Z direction shown in FIG. 6).

The wiring board MB1 includes a plurality of conductor layers WL1, WL2, WL3, WL4, WL5 and WL6 electrically connecting the terminal (PMP, PSP) close to the main surface MBt that is the mounting surface of the semiconductor device and the terminal (land 2LD) close to the main surface MBb that is the opposite surface. Each conductor layer is between the main surface MBt and the main surface MBb. Each conductor layer includes a conductor pattern such as a wiring that is a path for supplying an electrical signal and power. Further, an insulating layer 2e is arranged between the conductor layers. The conductor patterns formed in the respective conductor layers are electrically connected with each other through a via wiring 2v or a through hold wiring 2THW that is an interlayer conductive path penetrating the insulating layer 2e. In the present embodiment, note that a wiring board including six conductor layers is exemplified as one example of the wiring board MB1. However, the number of the conductor layers included in the wiring board MB1 not limited to six. For example, a wiring board including five conductor layers or less or seven conductor layers or more can be used as a modification example.

Among the plurality of conductor layers shown in FIG. 6, the conductor layer WL1 closest to the main surface MBt is covered with an insulating film (organic insulating film) SR1. The plurality of conductor patterns formed in the conductor layer WL1 include a terminal (terminal pattern) PSP, a terminal (terminal pattern) PMP and a ground pattern (ground plane) GP1. The terminal (terminal pattern) PSP is a conductor pattern electrically connected with the terminal BSP of the semiconductor device SP1. The terminal (terminal pattern) PMP is a conductor pattern electrically connected with the terminal BMP of the memory package MP1. The ground pattern (ground plane) GP1 is a conductor pattern which has a larger area than an area of the terminal PSP and the terminal PMP and to which the reference potential is supplied. A conductor pattern having a large area such as the ground pattern GP1 is called ground plane in some cases. A conductor pattern which has a large area and to which the rower supply potential is supplied is called power supply pattern or power supply plane. A collective term of the ground plane and the power supply plane is called a conductor plane in some cases.

The insulating film SR1 is provided with an opening, and each of the plurality of terminals PSP and the plurality of terminals PMP arranged in the conductor layer WL1 is exposed at the opening from the insulating film SR1. On the other hand, the ground pattern GP1 is covered with the insulating film SR1. In the example shown in FIG. 6, the entire ground pattern GP1 is covered with the insulating film SR1. However, as a modification example, a part of the ground pattern GP1 may be exposed from the insulating film SR1 in some cases.

Among the plurality of conductor layers, the conductor layer WL6 closest to the main surface MBb of the wiring board MB1 is provided with a plurality of lands 2LD, and the conductor layer WL6 is covered with the insulating film SR2. Each of the insulating film SR1 and the insulating film SR2 is a solder resist film. In FIG. 6, coverage of the entire lands 2LD with the insulating film SR2 is exemplified. However, the insulating film SR2 may be provided with an opening, and a part of the lands 2LD may be exposed at this opening. When a part of the lands 2LD is exposed, an electronic component (such as a capacitor, a power regulator or others) not illustrated may be connected with this exposed part.

In the case of the electronic device 100, the signal transmission path is mainly formed in the conductor layer WL1 and the conductor layer WL2, and a power supply path is mainly formed in each of the conductor layers WL3, SL4, WL5 and WL6.

The wiring board MB1 is formed by, for example, a build-up method of stacking the plurality of conductor layers on an upper surface 2Ct and a lower surface 2Cb of an insulating layer (core material, core insulating layer) 2CR made of a prepreg made of a glass fiber that has been impregnated with a resin. The conductor layer WL3 close to the upper surface 2Ct of the insulating layer 2CR and the conductor layer WL4 close to the lower surface 2Cb of the same are electrical connected with each other through a plurality of through hole wirings 2THW filled in a plurality of through holes penetrating from either one of the upper surface 2Ct and the lower surface 2Cb to the other. Each of the plurality of conductor patterns included in the wiring board MB1 is made of, for example, copper or a metallic material containing copper as a main component.

As explained with reference to FIG. 3, the electronic device 100 includes the plurality of signal transmission paths TPSG, and a high-frequency signal is transmitted to each of the plurality of signal transmission paths TPSG. Therefore, in order to suppress interference among the signal transmission paths TPSG, each of a lot of signal transmission paths in the wiring board MB1 is preferably arranged to have, for example, a strip line structure. In the case of the strip line structure, for example, the conductor plane (the conductor plane having the larger area) is arranged in upper and lower layers of one signal layer (a wiring layer where the signal wiring is arranged), and a fixed potential such as the reference potential VS1, the power supply potential VD1 or others is supplied to each conductor plane. Expansion of electromagnetic waves due to the flow of the high-frequency signals to the signal transmission paths TPSG can be suppressed.

In the example shown in FIG. 6, the wiring board MB1 has a region R1 overlapping the memory package MP1, a region R2 not overlapping the memory package MP1 and the semiconductor device SP1, and a region R3 overlapping the semiconductor device SP1. Each of the conductor layers WL1 to WL6 has the regions R1, R2 and R3.

In the region R2 shown in FIG. 6, a signal wiring WSG1 that is formed in the conductor layer WL2 is sandwiched between a pair of ground patterns GP (specifically between a ground pattern GP1 that is formed in the conductor layer WL1 and a ground pattern GP2 that is formed in the conductor layer WL3). In this manner, the part of the signal wiring WSG1 sandwiched between the ground pattern GP1 and the ground pattern GP2 has the strip line structure. On the other hand, each of parts of the signal wiring WSG1, the parts being formed in the region R1 and the region R2, does not have the strip line structure. Each of parts of the signal wiring WSG1, the parts being formed in the region R1 and the region R3, has a micro strip line structure. In the regions R1 and R3 in the conductor layer WL1, a lot of terminals PSP or a lot of terminals PMP need to be arranged, and therefore, it is difficult to arrange the ground pattern GP1. As a result, each of the parts of the signal wiring WSG1, the parts being formed in the region R1 and the region R3, has the micro strip line structure.

When one signal transmission path has the parts with the different wiring structures as described above, a changing part of the wiring structure tends to have an impedance discontinuous state. If the wiring width is assumed to be the same, the micro strip line structure has a smaller value of the parasitic capacitance on the signal wiring than that of the strip line structure, and therefore, tends to have a larger value of the characteristic impedance. Accordingly, the present embodiment suppresses the reduction in the signal quality by devising a signal wiring width of a particular part of the signal wiring having the micro strip line structure, the particular part particularly affecting the reduction in the signal quality.

<Peripheral Wiring Structure of Memory Package>

Figure 7:
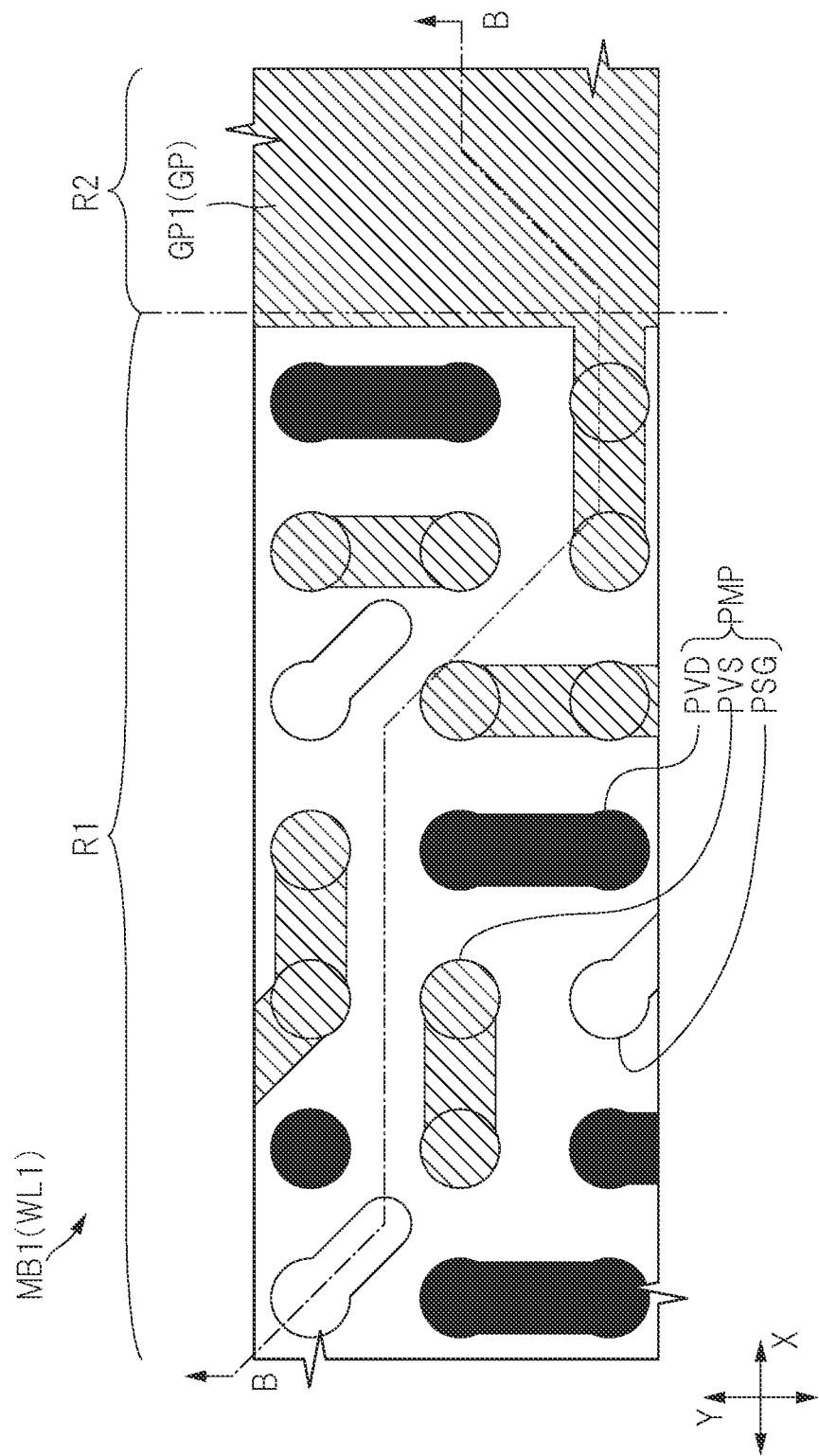
FIG. 7 is an enlarged plan view showing one example of a layout of a conductor layer that is the top layer of the plurality of conductor layers of the wiring board shown in FIG. 6.
Figure 8:
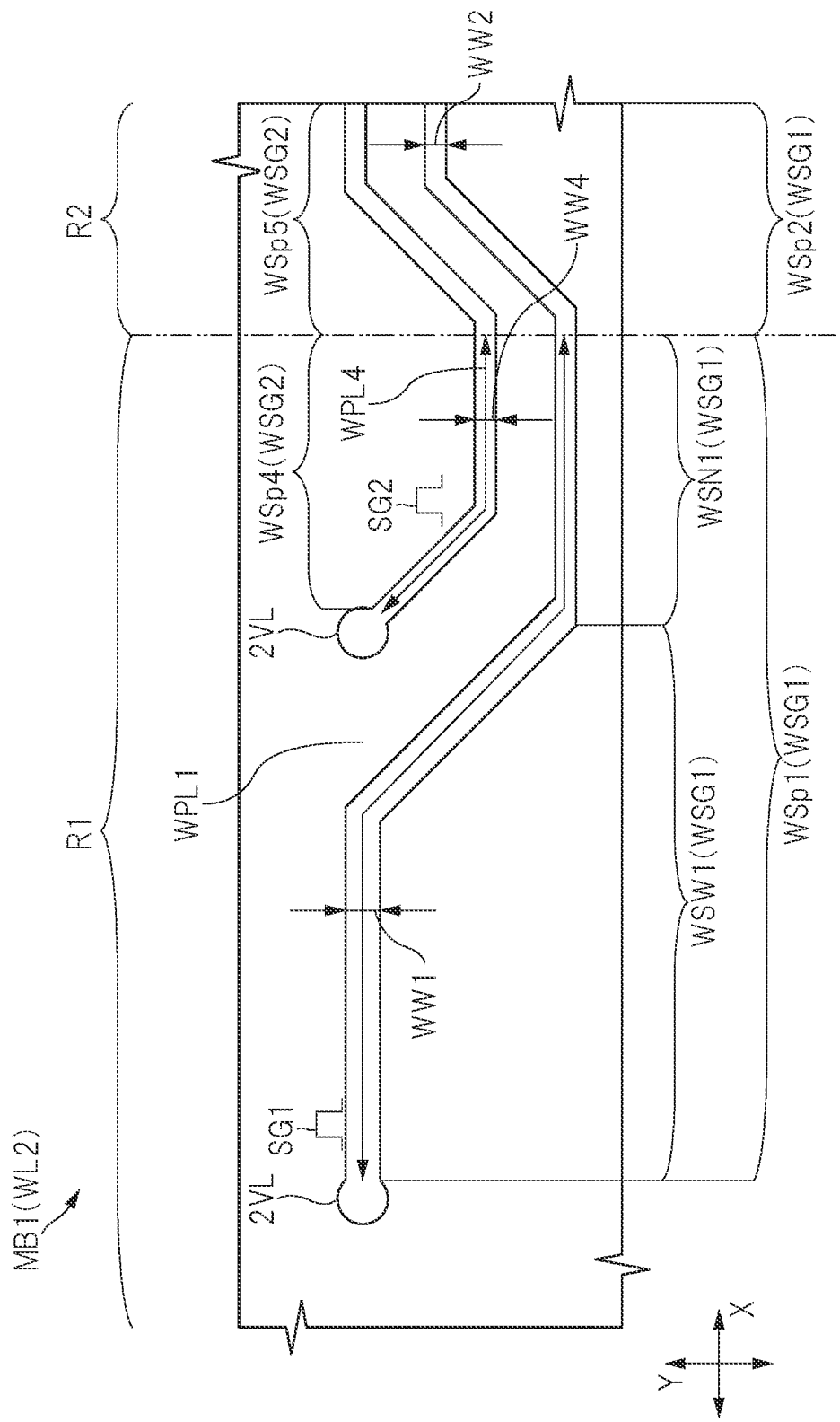
FIG. 8 is an enlarged plan view showing one example of a layout of a conductor layer that is one layer below the conductor layer shown in FIG. 7.
Figure 9:
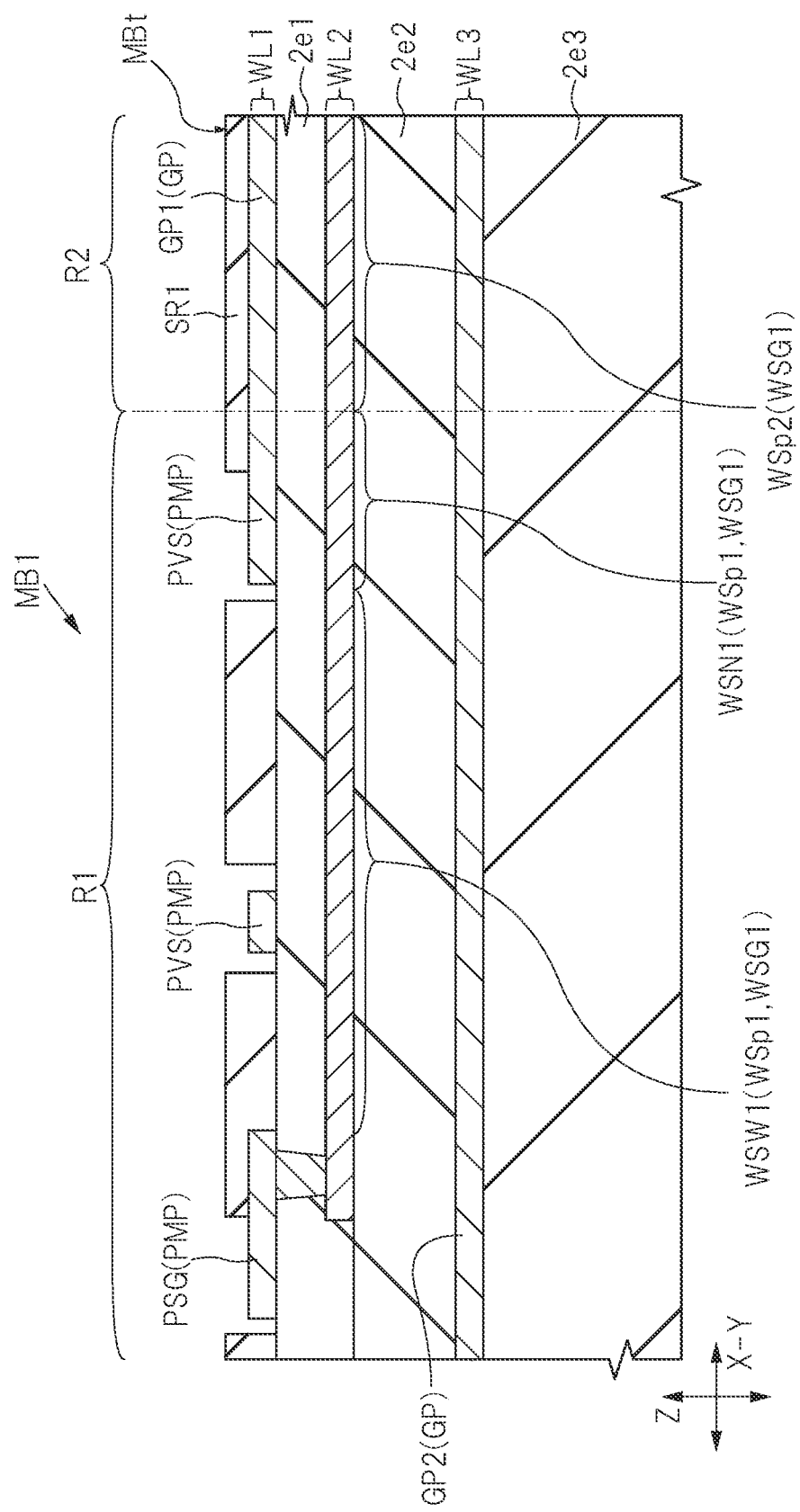
FIG. 9 is an enlarged cross-sectional view taken along a line B-B in FIG. 7.
Figure 10:
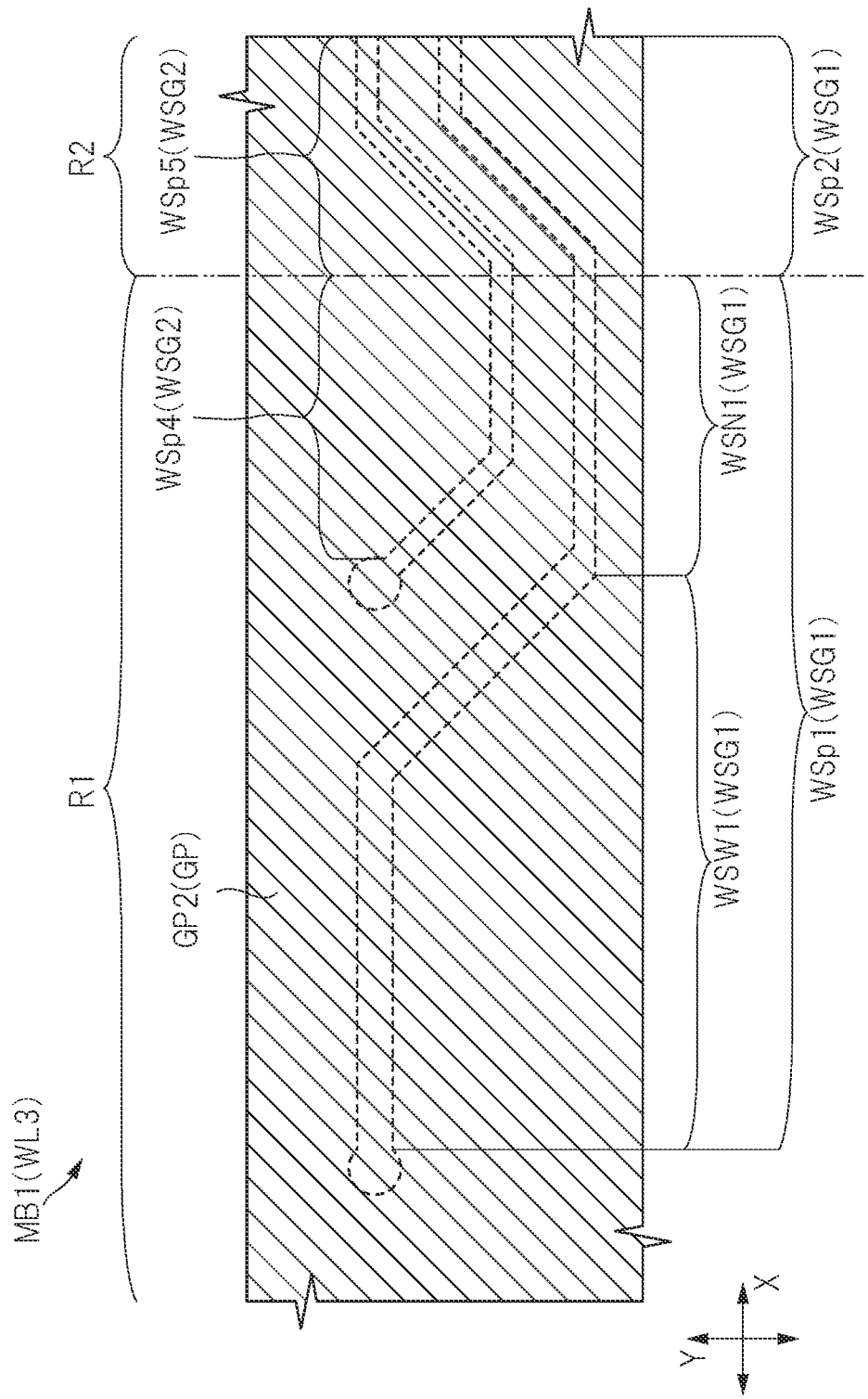
FIG. 10 is an enlarged plan view showing one example of a layout of a conductor layer that is one layer below the conductor layer shown in FIG. 8.

FIG. 7 is an enlarged plan view showing one example of a layout of the conductor layer that is the top layer of the plurality of conductor layers of the wiring board shown in FIG. 6. FIG. 8 is an enlarged plan view showing one example of a layout of the conductor layer that is one layer below the conductor layer shown in FIG. 7. FIG. 9 is an enlarged cross-sectional view taken along a line B-B of FIG. 7. FIG. 10 is an enlarged plan view showing one example of a layout of the conductor layer that is one layer below the conductor layer shown in FIG. 8. Each of FIGS. 7, 8 and 10 is an enlarged plan view of one part including a boundary between the region R1 and the region R2 of the wiring board MB1 shown in FIG. 6. However, FIG. 8 shows only two signal wirings to be focused in the following explanation, among the plurality of signal wirings at overlapping positions with the enlarged plan vies in FIGS. 7 and 10, and illustration of another signal wirings is omitted. In FIG. 10, each of the signal wiring WSG1 and the signal wiring WSG2 in the conductor layer WL2 (see FIG. 8) is denoted with a dot line.

As shown in FIG. 7, the plurality of terminals (terminal pattern) PMP are arranged in the region R1 of the conductor layer WL1. The plurality of terminals PMP are arranged in the matrix form on the conductor layer WL1. The plurality of terminals PMP include a plurality of signal terminals PSG which are electrically connected with the memory package MP1 (see FIG. 3) and to which the signals are transmitted. The plurality of terminals PMP further include a reference potential terminal PVS to which the reference potential VS1 (see FIG. 3) is supplied, and a power supply terminal PVD to which the power supply potential VD1 (see FIG. 3) is supplied. Each of the reference potential terminal PVS and the power supply terminal PVD has a terminal pattern in which adjacent terminals PMP are connected with each other as exemplified in FIG. 7 in some cases. On the other hand, the signal terminal PSG is electrically isolated from an adjacent terminal PMP.

The ground pattern GP1 which has the larger area than an area of the plurality of terminals (terminal pattern) PMP and to which the reference potential VS1 (see FIG. 3) is supplied is arranged in the region R2 of the conductor layer WL1. As shown in FIG. 10, the ground pattern GP2 to which the reference potential VS1 (see FIG. 3) is supplied is arranged in the conductor layer WL3 so as to straddle the region R1 and the region R2. In the region R1, the entire portion WSp1 of the signal wiring WSG1 overlaps the ground pattern GP2. In the region R2, the entire portion WSp2 of the signal wiring WSG1 overlaps the ground pattern GP2.

As shown in FIG. 8, the wiring board MB1 includes a plurality of signal wirings (that are the signal wiring WSG1 and the signal wiring WSG2 in FIG. 8) that are electrically connected with the memory package MP1 (see FIG. 6) and the semiconductor device SP1 (see FIG. 6) and that are the signal transmission paths TPSG (see FIG. 3). The plurality of signal wirings include the signal wiring WSG1 that is the transmission path for the signal SG1. In the present embodiment, note that the signal SG1 is, for example, a data signal.

The signal wiring WSG1 has the portion WSp1 arranged in the region R1 and the portion WSp2 arranged in the region R2. As shown in FIG. 9, in the thickness direction of the wiring board MB1, the portion WSp2 is sandwiched between the pair of ground patterns GP to which the reference potential is supplied. As understood from FIGS. 7 and 8, most of the portion WSp1 of the signal wiring WSG1 is not covered with the ground pattern GP1. On the other hand, most of the portion WSp2 of the signal wiring WSG1 is covered with the ground pattern GP1. Therefore, the value of the parasitic capacitance on the portion WSp1 is smaller than the value of the parasitic capacitance on the portion WSp2, and the value of the characteristic impedance tends to be large.

In the present embodiment, the portion WSp1 has a wide portion WSW1 having a larger wiring width WW1 than a wiring width WW2 of the portion WSp2. In this case, the term "wiring width (width)" is a length in a direction that is orthogonal to an extending direction of the wiring. In this case, a capacitance component of the wide portion WSW1 of the portion WSp1 is larger than a capacitance component of the portion WSp2. The capacitance component is one factor for determining the characteristic impedance in the signal transmission path, and the value of the characteristic impedance is in inverse proportion to the value of the parasitic capacitance. In other words, the present embodiment increases the wiring width of the portion having the small parasitic capacitance due to the ground pattern GP1 to reduce the difference in the capacitance component from that of the portion having the large parasitic capacitance, and therefore, suppresses the local increase in the characteristic impedance of the signal wiring.

A structure of the wiring board MB1 of the present embodiment will be explained in detail with reference to FIG. 9. The wiring board MB1 includes an insulating layer 2e2 and the conductor layer WL2 above the insulating layer 2e2. The wiring board MB1 includes an insulating layer 2e1 that covers the insulating layer 2e2 and the conductor layer WL2 and that is formed above the insulating layer 2e2 and the conductor layer WL2, the conductor layer WL1 above the insulating layer 2e1, and an insulating film SR1 that covers the insulating layer 2e1 and the conductor layer WL1 and that is formed above the insulating layer 2e1 and the conductor layer WL1. The plurality of signal wirings including the signal wiring WSG1 are formed in the conductor layer WL2. In the region R1 of the conductor layer WL1, the plurality of terminals (terminal pattern) PMP that are electrically connected with the memory package MP1 (see FIG. 6) are arranged. Among the pair of ground patterns GP sandwiching the portion WSp2, the ground pattern GP1 which has the larger area than an area of the plurality of terminals PMP and to which the reference potential is supplied is arranged in the region R2 of the conductor layer WL1. The ground pattern GP1 overlaps each of the plurality of signal wirings (the signal wiring WSG1 and the signal wiring WSG2 shown in FIG. 7).

As a modification example of the present embodiment, the signal wiring WSG1 is arranged in a conductor layer (such as the conductor layer WL3 or the conductor layer WL4 shown in FIG. 6) other than the conductor layer WL2 in some cases. However, the above-described issue (the issue is the difference in the characteristic impedance of the signal wiring WSG1 between the region R1 and the region R2) particularly appears when the signal wiring WSG1 is arranged in the conductor layer WL2.

Incidentally, if attention is paid only that the value of the characteristic impedance is made close to the design value, the entire portion WSp1 of the signal wiring WSG1 arranged in the region R1 is preferably the wide portion WSW1. However, depending on the convenience of the wiring layout, the entire portion WSp1 is difficult to be the wide portion WSW1 in some cases. For example, the conductor pattern including a lot of signal wirings are densely arranged in vicinity of the boundary between the region R1 and the region R2. Therefore, when the entire portion WSp1 is the wide portion WSW1, for example, the adjacent signal wirings are close to each other, and the influence of the cross talk noise increases in some cases. In such a case, narrowing of a wiring width of a part of the portion WSp1 of the signal wiring WSG1 is considerable.

As shown in FIG. 8, the portion WSp1 of the signal wiring WSG1 further has a narrow portion WSN1 having a smaller wiring width than the wiring width WW1 of the wide portion WSW1. The narrow portion WSN1 is arranged between the wide portion WSW1 and the portion WSp2 in an extending path of the signal wiring WSG1. In this case, even when a lot of signal wirings are arranged around the narrow portion WSN1, the adjacent wirings can be separate from each other, and therefore, the cross talk noise between the s al wirings can be reduced.

As shown in FIG. 7, each edge of the plurality of terminals PMP is exposed from the insulating film SR1 (see FIG. 9). Such a structure is called NSMD (Non Solder Mask Defined) structure. In the NSMD structure in which each edge of the plurality of terminals PMP is exposed from the insulating film SR1, a solder making the terminal BMP (see FIG. 7) is bonded to a side surface of the terminal PMP, and therefore, a bonding strength between the terminal BMP and the terminal PMP can be improved. On the other hand, in the NSMD structure, the conductor pattern having the large area cannot be used as, for example, the reference potential terminal PVS and the power supply terminal PVD shown in FIG. 7. The fact that each of the plurality of terminals PMP has the NSMD structure is one reason that the portion WSp1 of the signal wiring WSG1 shown in FIG. 8 in the region R1 has the micro strip line structure.

<Relation Between Signal Waveform and Length of Impedance Discontinuous Section>

Next, a "relation between a signal waveform and a length of the impedance discontinuous section" that has been found as a result of the studies made by the inventors of the present application will be explained. Note that the "length of the impedance discontinuous section" is a path length of a section where the value of the characteristic impedance shifts from the design value, in the signal transmission path. For example, in the case of the signal wiring WSG2 shown in FIG. 8, a path distance of the portion WSp4 corresponds to the "length of the impedance discontinuous section".

Figure 11:
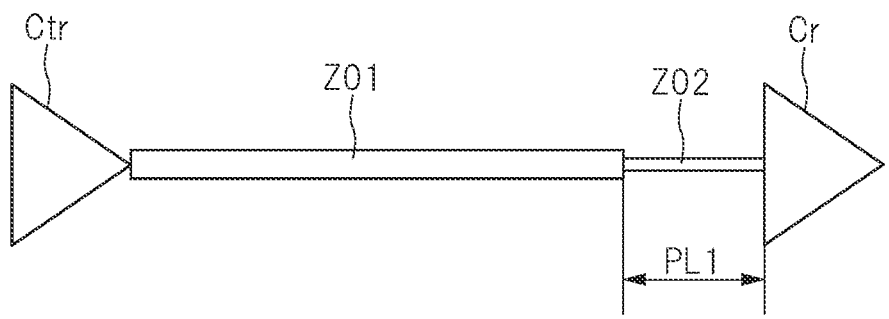
FIG. 11 is a circuit view schematically showing a value of a characteristic impedance of a signal transmission path extending from a transmission circuit to a reception circuit.
Figure 12:
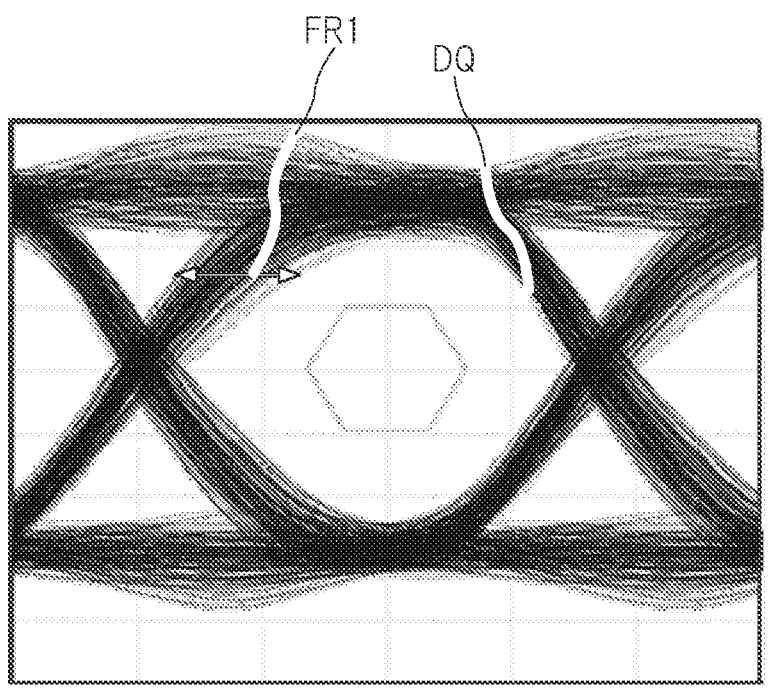
FIG. 12 is an explanatory view showing one example of a waveform of a data signal in a case of an impedance discontinuous section shown in FIG. 11 that is longer than $\lambda/20$.
Figure 13:
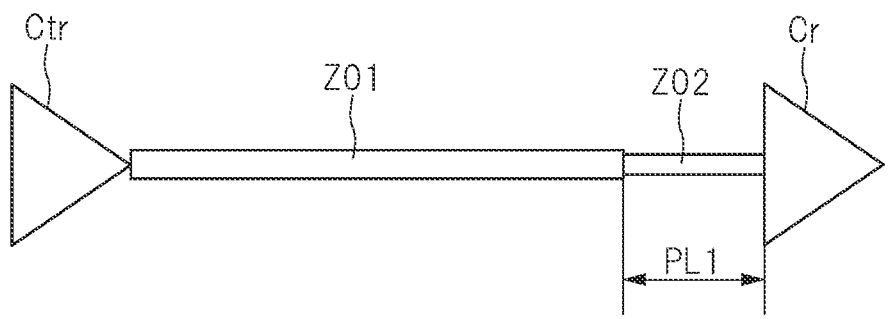
FIG. 13 is a circuit view schematically showing a state of arrangement of a wide portion as shown in FIG. 8 in the impedance discontinuous section shown in FIG. 11 to decrease the value of the characteristic impedance.
Figure 14:
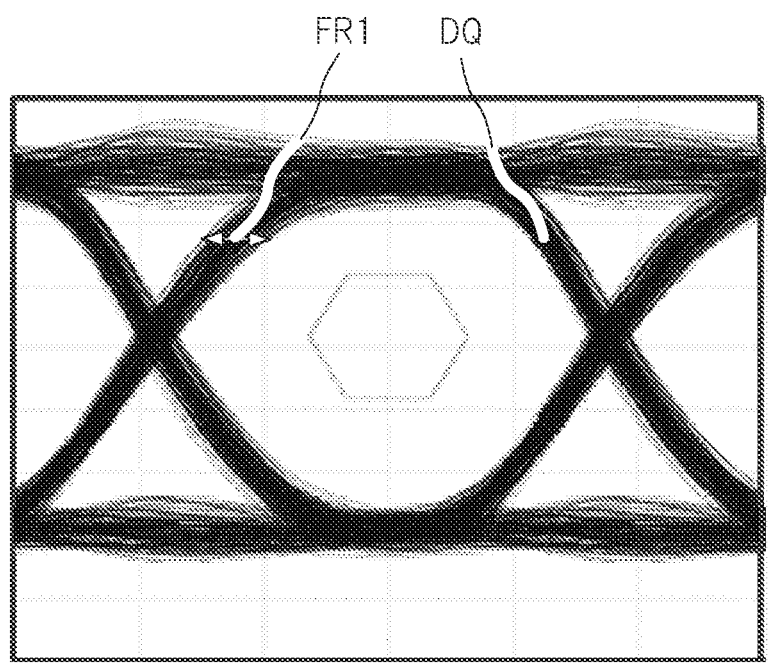
FIG. 14 is an explanatory view showing one example of a waveform of a data signal in a circuit shown in FIG. 13.

FIG. 11 is a circuit view schematically showing the value of the characteristic impedance of the signal transmission path extending from the transmission circuit to the reception circuit. FIG. 12 is an explanatory view showing one example of a waveform of the data signal in a case of an impedance discontinuous section shown in FIG. 11 that is longer than $\lambda/20$. FIG. 13 is a circuit view schematically showing a state in which a wide portion is arranged as shown in FIG. 8 to decrease the value of the characteristic impedance, in the impedance discontinuous section shown in FIG. 11. FIG. 14 is an explanatory view showing one example of a waveform of the data signal in the circuit shown in FIG. 13.

The signal transmission path for transmitting the signals from the transmission circuit Ctr to the reception circuit Cr as shown in FIGS. 11 and 13 has a section Z01 and a section Z02 having a different impedance from each other. A characteristic impedance of the section Z01 is almost the design value, and a characteristic impedance of the section Z02 is larger than the design value. When a wavelength of the signal transmitted to the circuit shown in FIG. 11 is assumed to be "$\lambda$", if a path length PL1 of the section Z02 is smaller than "$\lambda/20$", the deterioration of the signal waveform hardly occurs. Rather than that, the waveform is sharpened in some cases since the parasitic capacitance of the via 2v shown in FIG. 6 or others is cancelled by behavior of a part from the reception circuit Cr to the section Z02 as if the part was one element. On the other hand, if the path length PL1 of the section Z02 is "λ/20", no countermeasure such as the signal wiring WSG1 shown in FIG. 8 widens a shift range (shift width FR1) of the waveform of the data signal DQ as shown in FIG. 12, and decreases an eye opening.

On the other hand, when the value of the characteristic impedance of the section Z02 shown in FIG. 13 is improved to be nearly the design value as shown in FIG. 13 by the arrangement of the wide portion WSW1 shown in FIG. 8, the shift range (shift width FR1) of the waveform of the data signal DQ is narrowed as shown in FIG. 14, and the eye opening increases. In other words, the signal quality is improved.

The above-described findings are that the countermeasure that is the arrangement of the wide portion WSW1 as shown in the signal wiring WSG1 shown in FIG. 8 is effective when the path distance of the portion WSp1 is equal to or larger than λ/20. In the example shown in FIG. 8, the wiring length WPL of the portion WSp1 is equal to or larger than 1/20 of the wavelength of the signal SG1. For example, when the wavelength of the signal SG1 is assumed to be 40 mm, the wiring length WPL of the portion WSp1 is about 2 to 9 mm.

Also, the above-described findings are that, if the impedance discontinuous section is short, the signal waveform does not deteriorate even without the countermeasure for the signal wiring WSG1 shown in FIG. 8. In the example shown in FIG. 8, the plurality of signal wirings include the signal wiring WSG2 that is the transmission path for the signal SG2. The signal wiring WSG2 has a portion WSp4 arranged in the region R1 and a portion WSp5 arranged in the region R2. A wiring width WW4 of the portion WSp4 is smaller than the wiring width WW1 of the wide portion WSW1. A wiring length WPL1 of the portion WSp1 is larger than a wiring length WPL4 of the portion WSp4. In the present embodiment, the signal SG2 is, for example, a data signal as similar to the signal SG1.

The wiring length WPL1 of the portion WSp1 is equal to or larger than 1/20 of the wavelength of the signal SG1, and the wiring length WPL4 of the portion WSp4 is smaller than 1/20 of the wavelength of the signal SG2. The wavelength of the signal SG2 is, for example, 40 mm as similar to the wavelength of the signal SG1. In this case, the wiring length WPL4 of the portion WSp4 is smaller than 2 mm. The wiring length WPL4 of the portion WSp4 is the same as the wiring width of the portion WSp5. In such a case of no influence on the deterioration of the signal quality or such a case of small influence on the deterioration of the signal quality as described above, the wiring width of the portion arranged in the region R1 is preferably equal to the wiring width of the portion arranged in the region R2 as similar to the signal wiring WSG2. In this manner, a degree of freedom for the wiring layout is improved.

As already explained, the portion WSp1 has the narrow portion WSN1 having the smaller wiring width than the wiring width WW1 of the wide portion WSW1. The narrow portion WSN1 and the portion WSp4 are adjacent to each other. Each wiring width of the narrow portion WSN1 and the portion WSp4 is smaller than the wiring width WW1. Therefore, even when the arrangement pitch between the narrow portion WSN1 and the portion WSp4 is small, the occurrence of the cross talk noise can be suppressed.

<Peripheral Wiring Structure of SoC Package>

Figure 15:
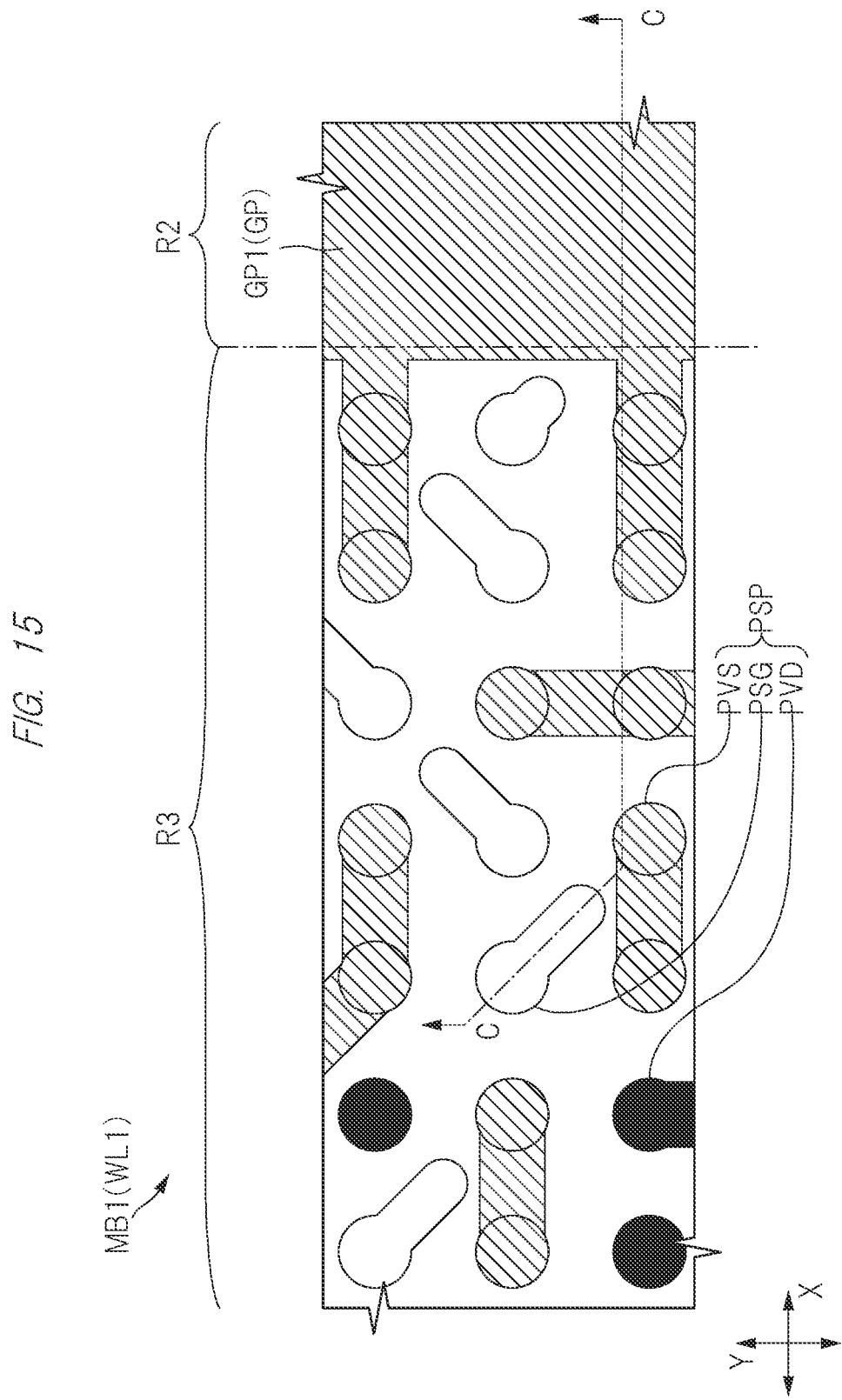
FIG. 15 is an enlarged plan view showing one example of a layout of the conductor layer that is the top layer of the plurality of conductor layers of the wiring board shown in FIG. 6.
Figure 16:
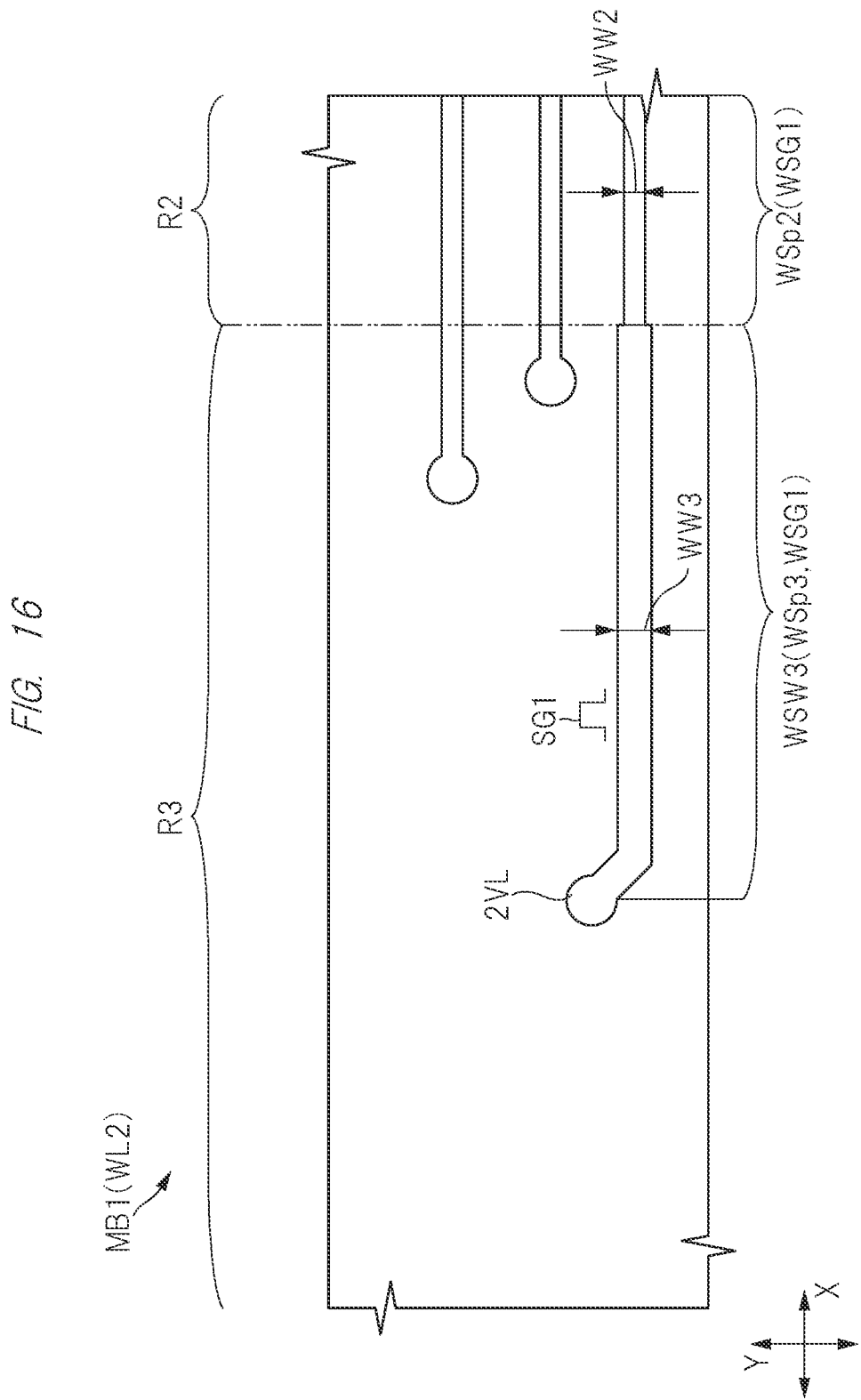
FIG. 16 is an enlarged plan view showing one example of a layout of the conductor layer that is one layer below the conductor layer shown in FIG. 15.
Figure 17:
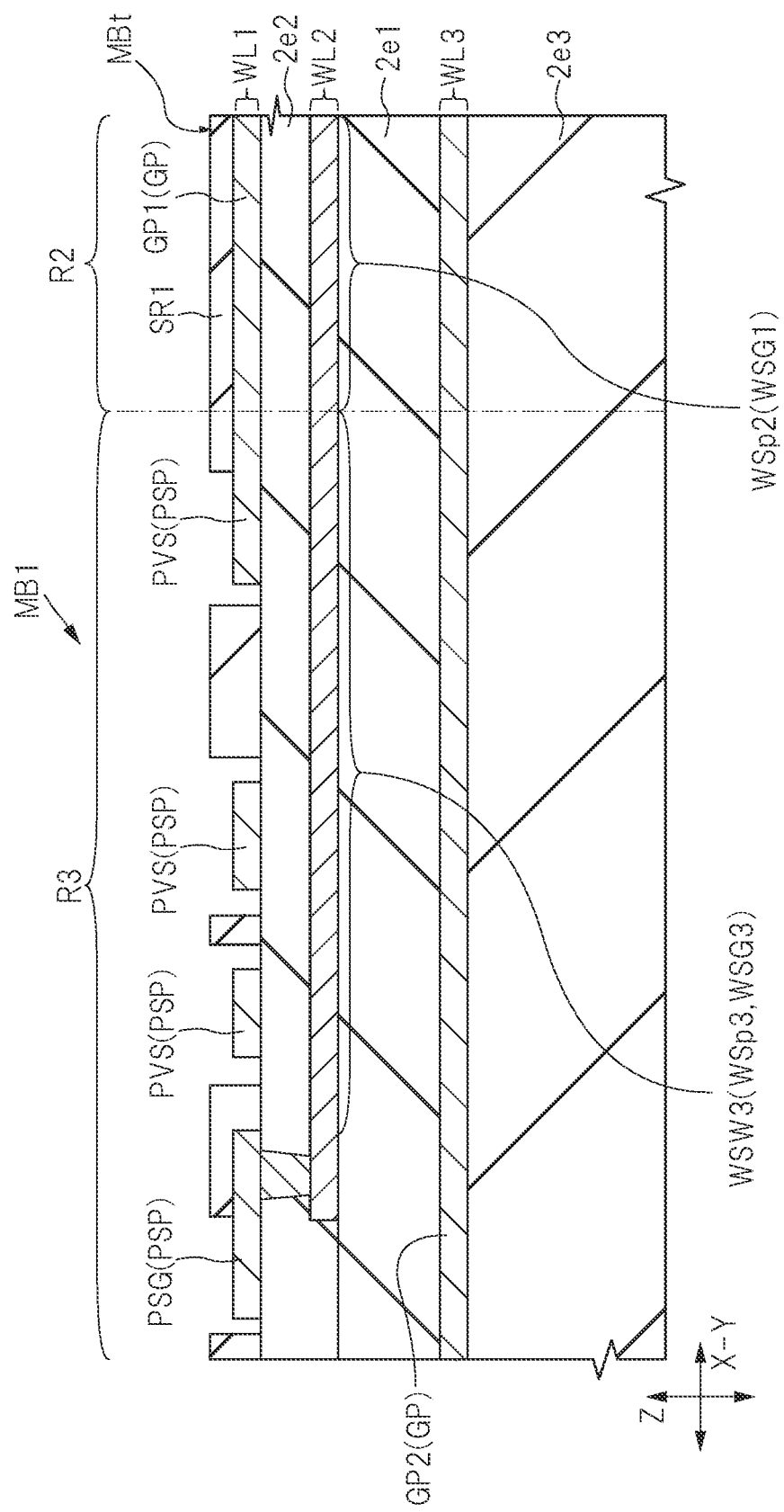
FIG. 17 is an enlarged cross-sectional view taken along a line C-C of FIG. 15.

FIG. 15 is an enlarged plan view showing one example of a layout of the conductor layer that is the top layer of the plurality of conductor layers of the wiring board shown in FIG. 6. FIG. 16 is an enlarged plan view showing one example of a layout of the conductor layer that is one layer below the conductor layer shown in FIG. 15. FIG. 17 is an enlarged cross-sectional view taken along a line C-C of FIG. 15. Each of FIGS. 15 and 16 is an enlarged plan view of a portion including a boundary between the region R3 and the region R2 of the wiring board MB1 shown in FIG. 6. However, FIG. 16 shows only three signal wirings of the plurality of signal wirings at positions overlapping the enlarged plan view shown in FIG. 15, and illustration of another signal wirings is omitted. A plan layout of the conductor layer WL3 shown in FIG. 17 is the same as FIG. 10 (except for a shape of the signal wiring illustrated with a dot line in FIG. 10), and therefore, illustration is omitted.

As shown in FIG. 6, the wiring board MB1 further has the region R3 overlapping the semiconductor device SP1. As shown in FIG. 15, the plurality of terminals (terminal pattern) PSP are arranged in the region R3 of the conductor layer WL1. The plurality of terminals PSP are arranged in a matrix form on the conductor layer WL1. The plurality of terminals PSP include a plurality of signal terminals PSG which are electrically connected with the semiconductor device SP1 (see FIG. 3) and to which signals are transmitted. The plurality of terminals PSP further include a reference potential terminal PVS to which the reference potential VS1 (see FIG. 3) is supplied, and a power supply terminal PVD to which the power supply potential VD1 (see FIG. 3) is supplied. Note that the reference potential terminal PVS and the power supply terminal PVD may be made of a terminal pattern in which the adjacent terminals PSP are connected with each other as exemplified in FIG. 15. On the other hand, the signal terminal PSG is electrically isolated from the adjacent terminal PSP.

The ground pattern GP1 which has the larger area than an area of the plurality of terminals (terminal pattern) PSP and to which the reference potential VS1 (see FIG. 3) is supplied is arranged in the region R2 of the conductor layer WL1. As shown in FIG. 17, the ground pattern GP2 to which the reference potential VS1 (see FIG. 3) is supplied is arranged in the conductor layer WL3 so as to straddle the region R3 and the region R2. In the region R3, the entire portion WSp3 of the signal wiring WSG1 overlaps the ground pattern GP2. In the region R2, the entire portion WSp2 of the signal wiring WSG1 overlaps the ground pattern GP2.

As shown in FIG. 17, in the thickness direction of the wiring board MB1, the portion WSp2 is sandwiched between a pair of ground patterns GP to which the reference potential is supplied. As understood from FIGS. 15 and 16, most of the portion WSp3 of the signal wiring WSG1 is not covered with the ground pattern GP1. On the other hand, most of the portion WSp2 of the signal wiring Wall is covered with the ground pattern GP2. Therefore, a value of the parasitic capacitance on the portion WSp3 tends to be smaller than a value of the parasitic capacitance on the portion WSp2, and a value of its characteristic impedance tends to be large.

In the present embodiment, as shown in FIG. 16, the signal wiring WSG1 further has the portion WSp3 arranged in the region R3. The portion WSp3 has a wide portion WSW3 having a larger wiring width WW3 than the wiring width WW2 of the portion WSp2.

The section Z02 shown in FIGS. 11 and 13 is closer to the reception circuit Cr than the transmission circuit Ctr. The impedance discontinuous section may be arranged in the region R3 shown in FIG. 16 in some cases. In this case, in order to suppress the deterioration of the signal quality in the impedance discontinuous section, the portion WSp3 of the signal wiring WSG1 shown in FIG. 16 is preferably provided with the wide portion WSW3. Note that the deterioration of the signal quality tends to occur in the vicinity of the reception circuit Cr (see FIG. 11). The signals are amplified in the vicinity of the transmission circuit Ctr (see FIG. 11). Therefore, even if the impedance discontinuous section exists in the vicinity of the transmission circuit Ctr, this impedance discontinuous section tends to be more difficult to be a cause of the signal deterioration than the impedance discontinuous section in the vicinity of the reception circuit Cr. For example, the signal SG1 shown in FIG. 16 is transmitted from the semiconductor device SP1 shown in FIG. 6, and is received by the memory package MP1. In this case, even when the wiring width WW3 of the portion WSp3 is the same as the wiring width WW2 of the portion WSp2 as a modification example of FIG. 16, a degree of the deterioration of the signal quality is small.

As described later to be a modification example, when the semiconductor chip SC1 is directly mounted on a portion where the semiconductor device SP1 shown in FIG. 6 is mounted, the arrangement pitch of the terminal PSP in the region R3 is further smaller. Depending on a degree of the arrangement pitch, it is difficult to arrange the wide portion WSW3 shown in FIG. 16 in some cases.

Modification Example

Figure 18:
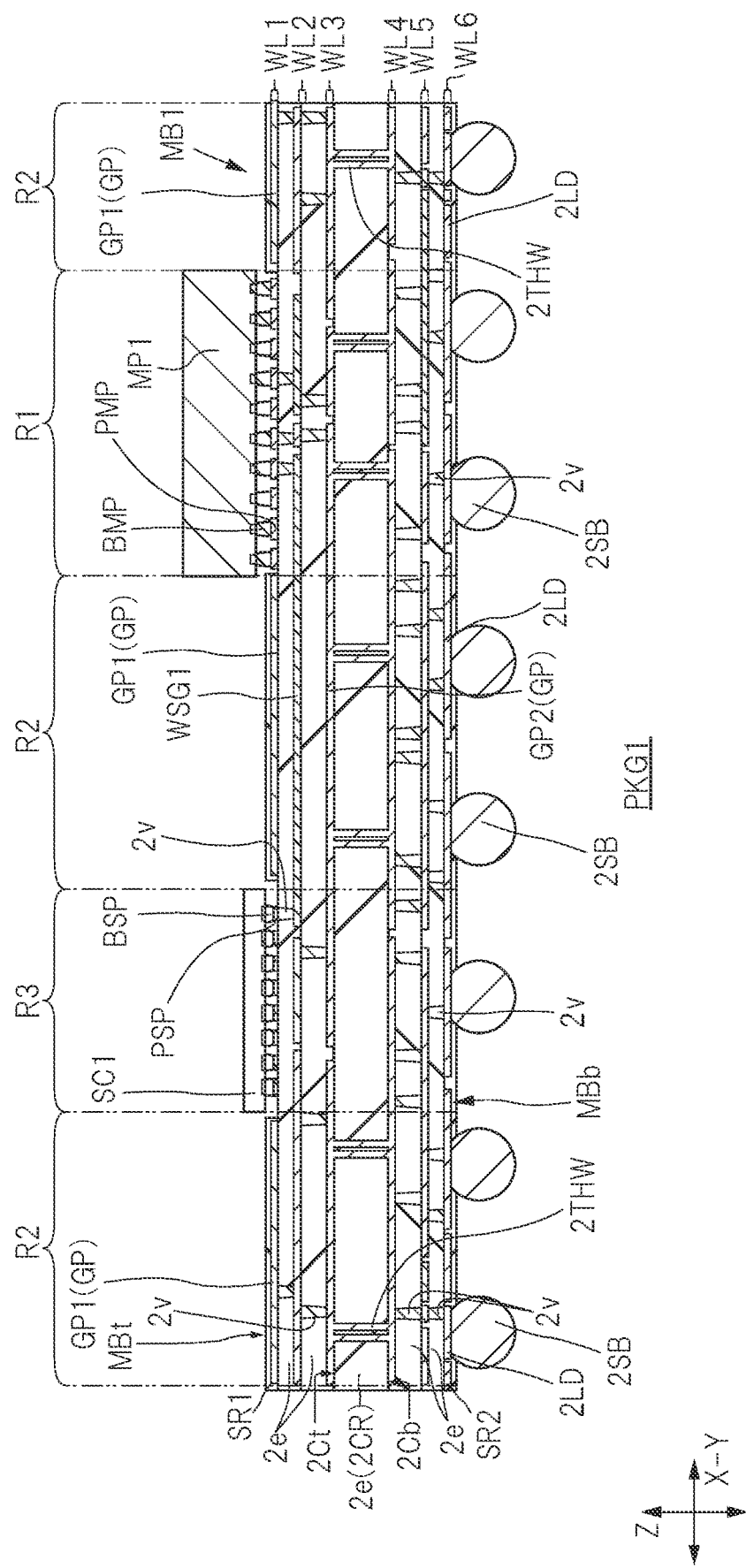
FIG. 18 is a cross-sectional view showing a modification example of FIG. 6.

A modification example that is a case of replacement of the semiconductor device (SoC package) SP1 shown in FIG. 6 with a semiconductor chip will be explained. FIG. 18 is a cross-sectional view showing a modification example of FIG. 6. In the following explanation, overlap explanation may be omitted for the common parts with the already-explained electronic device 100 with reference to FIG. 6 in the structure of the semiconductor device PKG1 shown in FIG. 18. In the following explanation, the structure that has been explained in the electronic device 100 is applicable as it is unless otherwise the incapability of the application of the structure of the electronic device 100 to the semiconductor device PKG1 is particularly explained.

The semiconductor device PKG1 shown in FIG. 18 is different from the electronic device 100 shown in FIG. 6 in that the semiconductor chip SC1 including the SoC formed thereon is directly mounted on the wiring board MB1. The semiconductor device PKG1 includes a memory package MP1 including a memory circuit, a semiconductor chip SC1 electrically connected with the memory package MP1, and a wiring board MB1 on which the memory package MP1 and the semiconductor chip SC1 are mounted. In the present modification example, the wiring board MB1 is not so-called motherboard but can be a smaller package board than the motherboard. A solder ball 2SB that is an external terminal of this semiconductor device PKG1 is formed on the main surface MBb of the wiring board MB1 making the semiconductor device PKG1, and the semiconductor device PKG1 is mounted on the motherboard through this solder ball 2SB.

The terminal arrangement of the semiconductor chip SC1 has a smaller pitch than that of the terminal arrangement of the semiconductor device SP1 explained with reference to FIG. 4. Therefore, the wiring width of the signal wiring WSG1 in the region R3 overlapping the semiconductor chip SC1 shown in FIG. 18 is the same as the wiring width of the signal wiring WSG1 in the region R2, that is, the wiring width of the portion WSp2 shown in FIG. 8. In other words, the wide portion WSW3 shown in FIG. 16 is difficult to be arranged in the region R3. Even in this case, when the wiring structure in the region R1 is made the same as the wiring structure in the region R1 of the wiring board MB1 of the electronic device 100, the signal quality can be improved.

The structure of the wiring board MB1 shown in FIG. 18 is the same as the structure of the wiring board MB1 explained with reference to FIGS. 6 to 14. In other words, the wiring board MB1 includes a plurality of signal wirings that are electrically connected with the memory package MP1 and the semiconductor chip SC1 and that are the signal transmission paths. The wiring board MB1 has the region R1 overlapping the memory package MP1 and the region R2 not overlapping the memory package MP1 and the semiconductor chip SC1. The plurality of signal wirings include the signal wiring WSG1 that is the transmission path for the signal SG1 shown in FIG. 8. The signal wiring WSG1 has the portion WSp1 arranged in the region R1 and the portion WSp2 arranged in the region R2. As shown in FIG. 9, in the thickness direction of the wiring board MB1, the portion WSp2 is sandwiched between the pair of ground patterns GP to which the reference potential is supplied. As shown in FIG. 7, the portion WSp1 has the wide portion WSW1 having the larger wiring width WW1 than the wiring width WW2 of the portion WSp2.

As shown in FIG. 9, the wiring board MB1 includes the insulating layer 2e2, the conductor layer WL2 above the insulating layer 2e2, the insulating layer 2e1 that covers the insulating layer 2e2 and the conductor layer WL2 and that is formed above the insulating layer 2e2 and the conductor layer WL2, the conductor layer WL1 above the insulating layer 2e1, and the insulating film SR1 that covers the insulating layer 2e1 and the conductor layer WL1 and that is formed above the insulating layer 2e1 and the conductor layer WL1. The plurality of signal wirings including the signal wiring WSG1 are formed in the conductor layer WL2. The plurality of terminals (terminal pattern) PMP that are electrically connected with the memory package MP1 are arranged in the region R1 of the conductor layer WL1 shown in FIG. 7. Among the pair of ground patterns GP sandwiching the portion WSp2, the ground pattern GP1 which has the larger area than an area of the plurality of terminals (terminal pattern) PMP and to which the reference potential is supplied is arranged in the region R2 of the conductor layer WL1 shown in FIG. 7. The ground pattern GP1 overlaps each of the plurality of signal wirings.

In the example shown in FIG. 8, the portion WSp1 further has the narrow portion WSN1 having the smaller wiring width than the wiring width WW1 of the wide portion WSW1. In the extending path of the signal wiring WSG1, the narrow portion WSN1 is arranged between the wide portion WSW1 and the portion Wsp2.

As understood from the already-explained relation between the signal waveform and the length of the impedance discontinuous section, the wiring length of the portion WSp1 is preferably equal to or larger than 1/20 of the wavelength of the first signal.

As shown in FIG. 8, the plurality of signal wirings include the signal wiring WSG2 that is the transmission path for the signal SG2. The signal wiring WSG2 has the portion WSp4 arranged in the region R1 and the portion WSp5 arranged in the region R2. The wiring width WW4 of the portion WSp4 is smaller than the wiring width WW1 of the wide portion WSW1. The wiring length WPL1 of the portion WSp1 is larger than the wiring length WPL4 of the portion WSp4.

The portion WSp1 further has the narrow portion WSN1 having the smaller wiring width than the wiring width WW1 of the wide portion WSW1. In the extending path of the signal wiring WSG1, the narrow portion WSN1 is arranged between the wide portion WSW1 and the portion Wsp2. The narrow portion WSN1 and the portion WSp4 are adjacent to each other.

The wiring length of the portion WSp1 is preferably equal to or larger than 1/20 of the wavelength of the signal SG1, and the wiring length of the portion WSp4 is preferably smaller than 1/20 of the wavelength of the signal SG2.

The plurality of terminals PMP that are electrically connected with the memory package MP1 are formed in the region R1 of the conductor layer WL1 as shown in FIG. 7, and each edge of the plurality of terminals PMP is exposed from the insulating film SR1 as shown in FIG. 9.

In the foregoing, the invention made by the inventors has been concretely described on the basis of the embodiments. However, it is needless to say that the present invention is not limited to the foregoing embodiments, and various modifications can be made within the scope of the present invention.

What is claimed is:

1. An electronic device comprising:
   a first semiconductor device;
   a second semiconductor device electrically connected with the first semiconductor device; and
   a wiring board on which the first semiconductor device and the second semiconductor device are mounted,
   wherein the wiring board includes a plurality of signal wirings electrically connected with each of the first semiconductor device and the second semiconductor device,
   wherein the plurality of signal wirings includes a first signal wiring that is a transmission path for a first signal,
   wherein the wiring board has:
      a first region overlapping the first semiconductor device; and
      a second region not overlapping each of the first semiconductor device and the second semiconductor device,
   wherein the first signal wiring has:
      a first portion arranged in the first region; and
      a second portion arranged in the second region,
   wherein, in a thickness direction of the wiring board, the second portion is positioned between two ground patterns to which a reference potential is supplied, while the first portion has a portion not positioned between two ground patterns to which a reference potential is supplied, and
   wherein the first portion has a first wide portion having a larger width than a width of the second portion.

2. The electronic device according to claim 1,
   wherein the wiring board includes:
      a first insulating layer;
      a first conductor layer positioned above the first insulating layer;
      a second insulating layer covering the first insulating layer and the first conductor layer and being formed above the first insulating layer and the first conductor layer;
      a second conductor layer positioned above the second insulating layer; and
      a first insulating film covering the second insulating layer and the second conductor layer and being formed above the second insulating layer and the second conductor layer,
   wherein the plurality of signal wirings including the first signal wiring are formed in the first conductor layer,
   wherein, in the second conductor layer,
      in the first region, a plurality of terminal patterns electrically connected with the first semiconductor device are arranged, and
      in the second region, a first ground pattern of the two ground patterns sandwiching the second portion, which has a larger area than an area of the plurality of terminal patterns and to which the reference potential is supplied, is arranged, and
   wherein the first ground pattern overlaps each of the plurality of signal wirings.

3. The electronic device according to claim 2,
   wherein the first portion further has a first narrow portion having a smaller width than a width of the first wide portion, and,
   wherein in an extending path of the first signal wiring, the first narrow portion is arranged between the first wide-portion and the second portion.

4. The electronic device according to claim 3,
   wherein a wiring length of the first portion is equal to or larger than 1/20 of a wavelength of the first signal.

5. The electronic device according to claim 2,
   wherein the plurality of signal wirings include a second signal wiring that is a transmission path for a second signal,
   wherein the second signal wiring has a fourth portion arranged in the first region and a fifth portion arranged in the second region,
   wherein a width of the fourth portion is smaller than a width of the first wide portion, and
   wherein a wiring length of the first portion is larger than a wiring length of the fourth portion.

6. The electronic device according to claim 5,
   wherein the first portion further has a first narrow portion having a smaller width than a width of the first wide portion,
   wherein, in an extending path of the first signal wiring, the first narrow portion is arranged between the first wide portion and the second portion, and
   wherein the first narrow portion and the fourth portion are adjacent to each other.

7. The electronic device according to claim 5,
   wherein a wiring length of the first portion is equal to or larger than 1/20 of a wavelength of the first signal, and
   wherein a wiring length of the fourth portion is smaller than 1/20 of a wavelength of the second signal.

8. The electronic device according to claim 2,
   wherein a plurality of terminals that are electrically connected with the first semiconductor device are formed in the first region of the second conductor layer, and
   wherein each edge of the plurality of terminals is exposed from the first insulating film.

9. The electronic device according to claim 1,
   wherein the wiring board further has a third region overlapping the second semiconductor device,
   wherein the first signal wiring further has a third portion arranged in the third region, and
   wherein the third portion has a second wide portion having a larger width than a width of the second portion.

10. The electronic device according to claim 1,
    wherein the first signal is a data signal.

11. The electronic device according to claim 1,
    wherein the first semiconductor device is a memory package.

12. A semiconductor device comprising:
    a memory package including a memory circuit;

a semiconductor chip electrically connected with the memory package; and a wiring board on which the memory package and the semiconductor chip are mounted, wherein the wiring board includes a plurality signal wirings electrically connected with each of the memory package and the semiconductor chin, wherein the plurality of signal wirings includes a first signal wiring that is a transmission path for a first signal, wherein the wiring board has:
- a first region overlapping the memory package; and
- a second region not overlapping each of the memory package and the semiconductor chip, wherein the first signal wiring has:
- a first portion arranged in the first region; and
- a second portion arranged in the second region, wherein, in a thickness direction of the wiring board, the second portion is positioned between two ground patterns to which a reference potential is supplied, while the first portion has a portion not positioned between two ground patterns to which a reference potential is supplied, and wherein the first portion has a first wide portion having a larger width than a width of the second portion.

13. The semiconductor device according to claim 12, wherein the wiring board includes:
- a first insulating layer;
- a first conductor layer positioned above the first insulating layer;
- a second insulating layer covering the first insulating layer and the first conductor layer and being formed above the first insulating layer and the first conductor layer;
- a second conductor layer positioned above the second insulating layer; and
- a first insulating film covering the second insulating layer and the second conductor layer and being formed above the second insulating layer and the second conductor layer, wherein the plurality of signal wirings including the first signal wiring are formed in the first conductor layer, wherein, in the second conductor layer,
- in the first region, a plurality of terminal patterns electrically connected with the memory package are arranged, and
- in the second region, a first ground pattern of the two ground patterns sandwiching the second portion, which has a larger area than an area of the plurality of terminal patterns and to which the reference potential is supplied, is arranged, and wherein the first ground pattern overlaps each of the plurality of signal wirings.

14. The semiconductor device according to claim 13, wherein the first portion further has a first narrow portion having a smaller width than a width of the first wide portion, and, wherein, in an extending path of the first signal wiring, the first narrow portion is arranged between the first wide portion and the second portion.

15. The semiconductor device according to claim 14, wherein a wiring length of the first portion is equal to or larger than $1/20$ of a wavelength of the first signal.

16. The semiconductor device according to claim 13, wherein the plurality of signal wirings include a second signal wiring that is a transmission path for a second signal, wherein the second signal wiring has a fourth portion arranged in the first region and a fifth portion arranged in the second region, wherein a width of the fourth portion is smaller than a width of the first wide portion, and wherein a wiring length of the first portion is larger than a wiring length of the fourth portion.

17. The semiconductor device according to claim 16, wherein the first portion further has a first narrow portion having a smaller width than a width of the first wide portion, wherein, in an extending path of the first signal wiring, the first narrow portion is arranged between the first wide portion and the second portion, and wherein the first narrow portion and the fourth portion are adjacent to each other.

18. The semiconductor device according to claim 16, wherein a wiring length of the first portion is equal to or large than $1/20$ of a wavelength of the first signal, and wherein a wiring length of the fourth portion is smaller than $1/20$ of a wavelength of the second signal.

19. The semiconductor device according to claim 13, wherein a plurality of terminals that are electrically connected with the memory package are formed in the first region of the second conductor layer, and wherein each edge of the plurality of terminals is exposed from the first insulating film.

20. The semiconductor device according to claim 12, wherein the first signal is a data signal.

* * * * *